United States Patent
Katsurayama et al.

(10) Patent No.: US 8,629,564 B2
(45) Date of Patent: Jan. 14, 2014

(54) SEMICONDUCTOR ELECTRONIC COMPONENT AND SEMICONDUCTOR DEVICE USING THE SAME

(75) Inventors: Satoru Katsurayama, Tokyo (JP); Tomoe Yamashiro, Tokyo (JP); Takashi Hirano, Tokyo (JP)

(73) Assignee: Sumitomo Bakelite Co., Ltd., Tokyo (JP)

(*) Notice: Subject to any disclaimer, the term of this patent is extended or adjusted under 35 U.S.C. 154(b) by 422 days.

(21) Appl. No.: 12/447,658

(22) PCT Filed: Oct. 30, 2007

(86) PCT No.: PCT/JP2007/071453
§ 371 (c)(1),
(2), (4) Date: Nov. 17, 2009

(87) PCT Pub. No.: WO2008/054011
PCT Pub. Date: May 8, 2008

(65) Prior Publication Data
US 2010/0102446 A1    Apr. 29, 2010

(30) Foreign Application Priority Data

Oct. 31, 2006   (JP) ................................. 2006-295545
Feb. 1, 2007    (JP) ................................. 2007-023020

(51) Int. Cl.
*H01L 23/48* (2006.01)

(52) U.S. Cl.
USPC ............. 257/777; 257/E23.039; 257/E23.169

(58) Field of Classification Search
USPC ............ 257/344, 29.279, 408, 409, 777, 787, 257/E23.039, E23.069, E23.169
See application file for complete search history.

(56) References Cited

U.S. PATENT DOCUMENTS

| | | | | |
|---|---|---|---|---|
| 5,296,737 A | * | 3/1994 | Nishimura et al. | 257/673 |
| 6,768,197 B2 | * | 7/2004 | Hosomi et al. | 257/737 |
| 7,241,348 B2 | * | 7/2007 | Wada et al. | 148/24 |
| 2005/0230804 A1 | | 10/2005 | Tanida et al. | |
| 2007/0001298 A1 | | 1/2007 | Ozawa et al. | |

FOREIGN PATENT DOCUMENTS

| | | |
|---|---|---|
| EP | 0913866 | 5/1999 |
| JP | 61-276873 | 12/1986 |
| JP | 03-012942 | 1/1991 |
| JP | 2003-231876 | 8/2003 |
| JP | 2003-264205 | 9/2003 |

(Continued)

OTHER PUBLICATIONS

Extended European Search Report for corresponding EP Application No. 07 83 1186.7, Mar. 8, 2011.

*Primary Examiner* — David Vu
(74) *Attorney, Agent, or Firm* — Ditthavong Mori & Steiner, P.C.

(57) ABSTRACT

The problem of the present invention is to provide a chip-on-chip type semiconductor electronic component and a semiconductor device which can meet the requirements for further density increase of semiconductor integrated circuits.
The present invention provides: a chip-on-chip type semiconductor electronic component in which a circuit surface of a first semiconductor chip and a circuit surface of a second semiconductor chip are opposed to each other, wherein the distance X between the first semiconductor chip and the second semiconductor chip is 50 μm or less, and the shortest distance Y between the side surface of the second semiconductor chip and the first external electrode is 1 mm or less; and a semiconductor device comprising the same.

27 Claims, 8 Drawing Sheets

(56) References Cited

FOREIGN PATENT DOCUMENTS

| | | | | | |
|---|---|---|---|---|---|
| JP | 2003-264205 A | * | 9/2003 | | H01L 21/56 |
| JP | 2004-244486 A | * | 2/2004 | | C09J 7/00 |
| JP | 2004-174574 | * | 6/2004 | | B23K 35/363 |
| JP | 2004-244486 | | 9/2004 | | |
| JP | 3769688 | | 9/2004 | | |
| JP | 2004-296917 | | 10/2004 | | |
| JP | 2005-44989 | | 2/2005 | | |
| JP | 2006-060067 | * | 2/2006 | | H01L 23/52 |
| JP | 2006-60067 | | 3/2006 | | |
| WO | WO 2005/048348 | | 5/2005 | | |
| WO | WO 2005/122257 | | 12/2005 | | |

* cited by examiner (a)

(b)

(c)

SEMICONDUCTOR ELECTRONIC COMPONENT AND SEMICONDUCTOR DEVICE USING THE SAME

TECHNICAL FIELD

The present invention relates to a chip-on-chip type semiconductor electronic component and a semiconductor device comprising the same. More specifically, the present invention relates to a semiconductor electronic component which can meet the requirements for density increase of semiconductor integrated circuits and a semiconductor device comprising the same.

BACKGROUND ART

Recently, as the need for sophistication and miniaturization of electronic devices has been increased, the technique for high-density package of semiconductor integrated circuits has been developed. One example of such packaging techniques is a chip-on-chip type System in Package (SiP) in which a semiconductor chip is mounted on another semiconductor chip face down. Attention is focused on this structure because it allows thickness reduction of packages and is excellent in reliability of electrical connection.

In general, in a chip-on-chip type SiP, connection between semiconductor chips is provided via fine bumps according to a flip-chip method. In this case, in order to ensure electrical connection strength and mechanical connection strength, a filling resin is injected into the position between the semiconductor chips (underfill filling).

However, in this step of underfill filling, the filling resin injected between the semiconductor chips bleeds and an external electrode provided on the surface of the lower semiconductor chip is contaminated thereby, and for this reason, there is a problem that it is impossible to perform wire bonding. Therefore, the distance between the side surface of the upper semiconductor chip and the external electrode provided on the lower semiconductor chip must be about 1.5 cm. Moreover, since an adhesive is injected between semiconductor chips, the chip gap must be at least about 40 μm. These requirements interrupt high-density package of semiconductor integrated circuits.

Methods in which electrical connection and filling between semiconductor chips are performed together via an anisotropic conductive film are also known. For example, Japanese Laid-Open Patent Publication No. 61-276873 (Patent Document 1) describes an adhesion tape including solder particles. The document describes a method in which the adhesion tape is interposed between members to be subjected to thermocompression bonding, and thereby solder particles are interposed between electrical connection portions of the members and other portions are filled with a resin component. Further, Japanese Patent No. 3769688 (Patent Document 2) describes a method of connecting terminals using an electrically conductive adhesive including electrically conductive particles and a resin component which is not completely cured at the meting point of the electrically conductive particles.

However, none of these methods realized further improvement of density increase of semiconductor integrated circuits in chip-on-chip type SiPs.

DISCLOSURE OF THE INVENTION

Under the above-described circumstances, the development of a chip-on-chip type semiconductor electronic component and a semiconductor device which can meet the requirements for further density increase of semiconductor integrated circuits is desired.

The present inventors diligently made researches in consideration of the above-described problems of the conventional techniques, and successfully performed electrical connection and filling between semiconductor chips together by minimizing bleeding of a resin component at the time of meltdown of an adhesion film. Thus, a chip-on-chip type semiconductor electronic component and a semiconductor device which can meet the requirements for further density increase were successfully obtained.

That is, the present invention provides a semiconductor electronic component, a semiconductor device comprising the semiconductor electronic component and the like as follows:

[1] A chip-on-chip type semiconductor electronic component, which comprises: a first semiconductor chip having a circuit surface on which first internal electrodes and first external electrodes are provided; and a second semiconductor chip having a circuit surface on which second internal electrodes electrically connected to the first internal electrodes are provided, wherein the circuit surface of the first semiconductor chip and the circuit surface of the second semiconductor chip are opposed to each other, and wherein:

the gap between the first semiconductor chip and the second semiconductor chip is filled with an insulating resin;

the distance between the first semiconductor chip and the second semiconductor chip is 50 μm or less; and the shortest distance between the side surface of the second semiconductor chip and the first external electrode is 1 mm or less.

[2] A chip-on-chip type semiconductor electronic component, which comprises: a first semiconductor chip having a circuit surface on which first internal electrodes and first external electrodes are provided; and a second semiconductor chip having a circuit surface on which second internal electrodes electrically connected to the first internal electrodes are provided, wherein the circuit surface of the first semiconductor chip and the circuit surface of the second semiconductor chip are opposed to each other, and wherein:

the gap between the first semiconductor chip and the second semiconductor chip is filled with an insulating resin;

the distance between the first semiconductor chip and the second semiconductor chip is 25 or less; and the shortest distance between the side surface of the second semiconductor chip and the first external electrode is 1 mm or less.

[3] The semiconductor electronic component according to item [1] or [2], wherein the shortest distance between the first internal electrodes adjacent to each other is 50 μm or less.

[4] The semiconductor electronic component according to any one of items [1] to [3], wherein the second semiconductor chip is provided on an approximate center area of the first semiconductor chip.

[5] The semiconductor electronic component according to any one of items [1] to [4], wherein the first external electrodes are provided on the marginal portion of the first semiconductor chip.

[6] The semiconductor electronic component according to any one of items [1] to [5], wherein: between the first semiconductor chip and the second semiconductor chip, solder bumps provided on at least either one of the first internal electrodes and the second internal electrodes and a thermosetting adhesive film comprising a flux compound are interposed to be heat-sealed, and thereby the first internal electrodes and the second internal electrodes are electrically connected to each other; and the gap between the first semiconductor chip and the second semiconductor chip is filled with the insulating resin.

[7] The semiconductor electronic component according to item [6], wherein the thermosetting adhesive film comprises 10 to 50 wt % of film forming resin, 30 to 80 wt % of curable resin and 1 to 20 wt % of curing agent having flux activity.

[8] The semiconductor electronic component according to item [7], wherein the film forming resin is at least one substance selected from the group consisting of (meth)acrylic resin, phenoxy resin and polyimide resin.

[9] The semiconductor electronic component according to item [7] or [8], wherein the curable resin is epoxy resin.

[10] The semiconductor electronic component according to any one of items [7] to [9], wherein the curing agent having flux activity is at least one substance selected from the group consisting of aliphatic dicarboxylic acid and compounds having a carboxyl group and a phenolic hydroxyl group.

[11] The semiconductor electronic component according to any one of items [6] to [10], wherein, in the case where a tin-containing solder ball having the diameter of 500 μm is provided on the thermosetting adhesive film and heated at a temperature which is 30° C. higher than the melting point of the solder ball for 20 seconds, the solder wet-spreading ratio of the thermosetting adhesive film represented by the following formula (I) is 40% or higher:

Solder wet-spreading ratio(%)=[{(diameter of solder ball)−(thickness of solder after wet spreading)}/(diameter of solder ball)]×100          (I)

[12] The semiconductor electronic component according to any one of items [6] to [11], wherein, in the case where the thickness of the thermosetting adhesive film is 100 μm, the melt viscosity thereof at 223° C. is 10 Pa·s to 200000 Pa·s.

[13] The semiconductor electronic component according to any one of items [1] to [5], wherein: between the first semiconductor chip and the second semiconductor chip, a thermosetting adhesive film comprising solder powder and a flux compound is interposed to be heat-sealed, and thereby the first internal electrodes and the second internal electrodes are electrically connected to each other; and the gap between the first semiconductor chip and the second semiconductor chip is filled with the insulating resin.

[14] The semiconductor electronic component according to item [13], wherein constituents other than the solder powder in the thermosetting adhesive film comprise 10 to 50 wt % of film forming resin, 30 to 80 wt % of curable resin and 1 to 20 wt % of curing agent having flux activity.

[15] The semiconductor electronic component according to item [13] or [14], wherein the thermosetting adhesive film comprises 30 to 200 parts by weight of solder powder per 100 parts by weight of constituents other than the solder powder.

[16] The semiconductor electronic component according to item [14] or [15], wherein the film forming resin is at least one substance selected from the group consisting of (meth)acrylic resin, phenoxy resin and polyimide resin.

[17] The semiconductor electronic component according to any one of items [14] to [16], wherein the curable resin is epoxy resin.

[18] The semiconductor electronic component according to any one of items [14] to [17], wherein the curing agent having flux activity is at least one substance selected from the group consisting of aliphatic dicarboxylic acid and compounds having a carboxyl group and a phenolic hydroxyl group.

[19] The semiconductor electronic component according to any one of items [13] to [18], wherein a curing temperature $T_1$ of the thermosetting adhesive film and a melting point $T_2$ of the solder powder satisfy the following formula (II):

$$T_1 \geq T_2 + 20° C. \quad \text{(II)}$$

and the melt viscosity of the thermosetting adhesive film at the melting point $T_2$ of the solder powder is 50 Pa·s to 5000 Pa·s.

[20] The semiconductor electronic component according to any one of items [13] to [19], wherein, in the case where the thickness of the thermosetting adhesive film is 100 μm, the melt viscosity thereof at 138° C. is 1 Pa·s to 10000 Pa·s.

[21] The semiconductor electronic component according to any one of items [1] to [20], wherein a semiconductor chip is further provided on a surface opposite to the circuit surface of the second semiconductor chip.

[22] The semiconductor electronic component according to any one of items [1] to [21], further comprising a third semiconductor chip having a circuit surface on which a third internal electrode is provided, wherein:

the circuit surface of the third semiconductor chip is opposed to the surface opposite to the circuit surface of the second semiconductor chip;

the gap between the second semiconductor chip and the third semiconductor chip is filled with the insulating resin; and the third internal electrode is electrically connected to the second internal electrode via through-holes provided in the thickness direction of the second semiconductor chip.

[23] A semiconductor device on which the semiconductor electronic component according to any one of items [1] to [22] is mounted.

The present invention can provide a semiconductor electronic component in which the distance between semiconductor chips is 50 μm or less, and preferably 25 μm or less. By using the semiconductor electronic component of the present invention, the total thickness of the whole component to be packaged in a semiconductor device can be reduced, and the weight of the whole component to be packaged can also be reduced.

The present invention can also provide a semiconductor electronic component in which the shortest distance between the side surface of the upper semiconductor chip and an external electrode provided on the lower semiconductor chip is 1 mm or less. By using the semiconductor electronic component of the present invention, the integration density of semiconductor chips, which one package can include, can be increased. Further, the whole component to be packaged can be miniaturized.

Moreover, according to a preferred embodiment of the present invention, the present invention can provide a semiconductor electronic component in which the shortest distance between internal electrodes provided on the surface of a semiconductor chip is 50 μm or less. By using the semiconductor electronic component of the present invention, the amount of information, which one package can include, can be increased.

According to a preferred embodiment of the present invention, the present invention can provide a multiple-layer stack type semiconductor electronic component in which a plurality of semiconductor chips are stacked. According to a preferred embodiment of the present invention, in the multiple-layer stack type semiconductor electronic component of the present invention, the distance between semiconductor chips is 50 μm or less, and preferably 25 μm or less, and the shortest distance between the side surface of the upper semiconductor chip and an external electrode provided on the lower semiconductor chip is 1 mm or less. Further, according to a preferred embodiment of the present invention, in the multiple-layer stack type semiconductor electronic component of the present invention, the shortest distance between internal electrodes provided on the surface of a semiconductor chip is 50 μm or less. By using the above-described semiconductor electronic component of the present invention, the integration density of semiconductor chips, which one package can include, can be further increased.

Furthermore, the present invention can provide a semiconductor device in which the semiconductor electronic component of the present invention is mounted on a substrate. The semiconductor device of the present invention meets requirements for sophistication and miniaturization of electronic devices since it allows increase of the integration density of semiconductor chips which one package can include.

Figure 1:
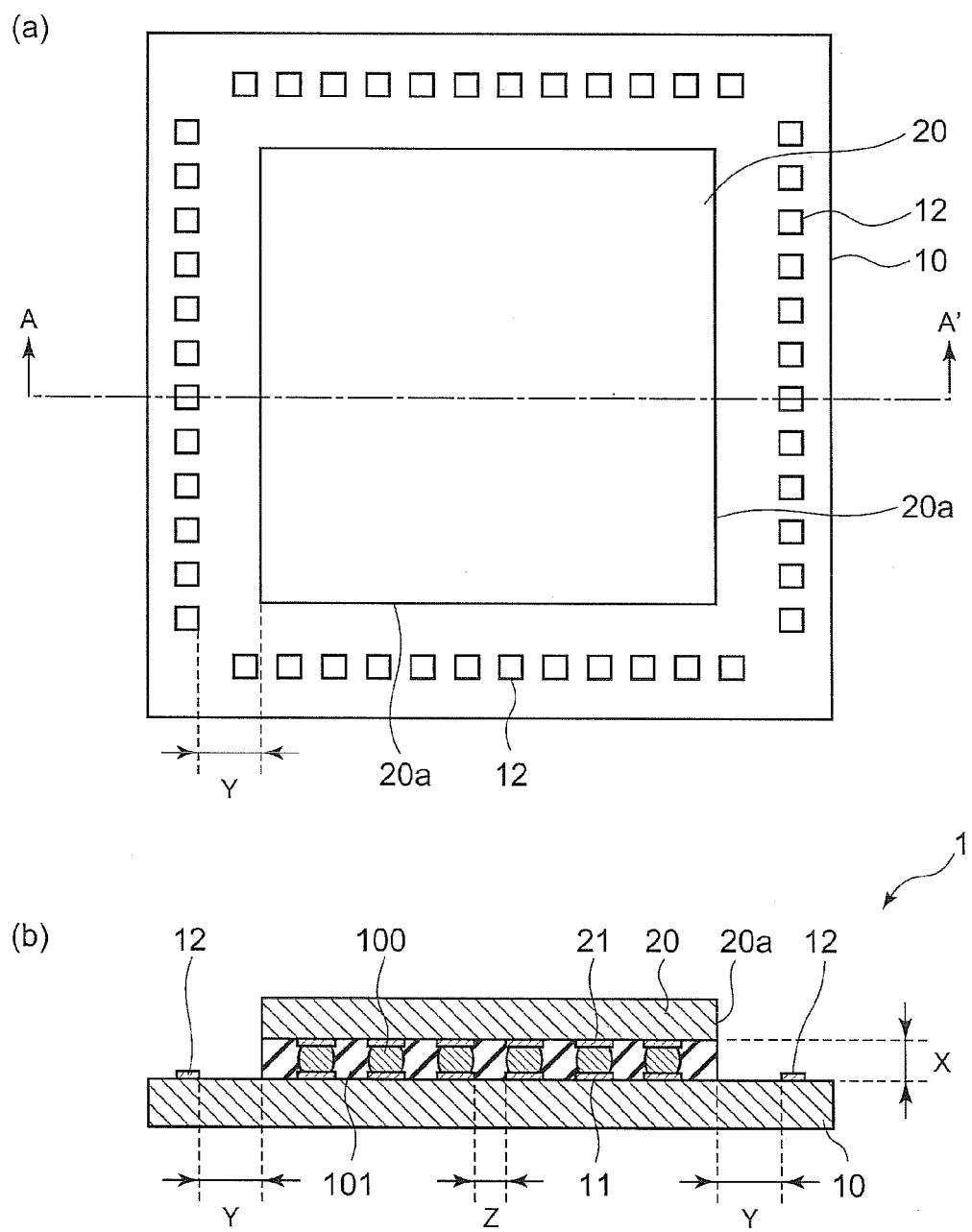
FIG. 1 shows a schematic top view and a schematic cross sectional view of a semiconductor electronic component according to one embodiment of the present invention.

EXPLANATIONS OF LETTERS OR NUMERALS 1 semiconductor electronic component
2 multiple-layer stack type semiconductor electronic component
10 first semiconductor chip
20 second semiconductor chip
30 third semiconductor chip
11 first internal electrode
12 external electrode
20a side surface of second semiconductor chip
21 second internal electrode
30a side surface of third semiconductor chip
31 third internal electrode
100 solder area
101 insulating area
102 through-hole
103 UBM layer
104 UBM layer
105 solder bump
106 thermosetting adhesive film
107 protecting layer
108 thermosetting adhesive film
108a solder powder
109 circuit board
110 wire
111 encapsulating resin
112 bump electrode
113 passivating layer
114 thermally-oxidized film

BEST MODE FOR CARRYING OUT THE INVENTION

Hereinafter, preferred embodiments of the present invention will be described by way of examples.
1. Semiconductor Electronic Component
Firstly, a semiconductor electronic component according to one embodiment of the present invention will be described with reference to FIG. 1.

FIG. 1(a) is a schematic top view of a semiconductor electronic component according to one embodiment of the present invention. FIG. 1(b) is a schematic cross sectional view taken along line A-A' in FIG. 1(a). In FIG. 1(b), the semiconductor electronic component 1 according to the embodiment has a structure in which a circuit surface (not shown) of a first semiconductor chip 10 on which internal electrodes 11 are provided is opposed to a circuit surface (not shown) of a second semiconductor chip 20 on which internal electrodes 21 are provided. As shown in FIG. 1(b), the internal electrodes 11 are patterned to correspond to the internal electrodes 21, and a solder area 100 is formed between each internal electrode 11 and each internal electrode 21 which are opposed to each other. Two opposed internal electrodes are electrically connected to each other via the solder area 100. Further, the gap between the semiconductor chip 10 and the semiconductor chip 20 is filled with an insulating resin to form an insulating resin area 101, by which internal electrodes adjacent to each other are electrically insulated. On the circuit surface of the semiconductor chip 10, external electrodes 12 for connecting an integrated circuit (not shown) formed on the circuit surface of the semiconductor chip 10 to a circuit board made of silicon or the like are provided.

The distance X between the semiconductor chip 10 and the semiconductor chip 20 is 50 μm or less, preferably 25 μm or less, more preferably 5 μm or less, and even more preferably 3 μm or less. When producing the semiconductor electronic component of the present invention using the production method according to the first embodiment of the present invention described later, the distance X depends on the size of a solder ball. For example, when using a solder ball having the diameter of 50 μm, the distance X is preferably 35 to 48 μm, and more preferably 40 to 45 μm. When producing the semiconductor electronic component of the present invention using the production method according to the second embodiment of the present invention described later, the distance X is preferably 5 μm or less, and more preferably 3 μm or less. In this regard, the distance X refers to the distance between the circuit surface of the semiconductor chip 10 and the circuit surface of the semiconductor chip 20. From the viewpoint of ensuring the connection strength between the semiconductor chips, the distance X is preferably 1 μm or more.

Further, the shortest distance Y between the side surface 20a of the semiconductor chip 20 and the external electrode 12 provided on the circuit surface of the semiconductor chip 10 is 1 mm or less, preferably 0.7 mm or less, and more preferably 0.5 mm or less. In order to maintain a space for wire bonding, the shortest distance Y is generally 0.05 mm or more, but the present invention is not particularly limited thereto. In the expression "the shortest distance Y between the side surface 20a of the semiconductor chip 20 and the external electrode 12 provided on the semiconductor chip 10", the term "shortest" is purposely used in order to express a distance between points which are closest to each other in the case where the distance between the side surface 20a of the semiconductor chip 20 and the external electrode 12 provided on the circuit surface of the semiconductor chip 10 is not fixed.

Moreover, the shortest distance Z between the internal electrodes adjacent to each other (a plurality of internal electrodes are provided on the circuit surface of the semiconductor chip) is preferably 50 μm or less, more preferably 30 μm or less, and even more preferably 20 μm or less. From the viewpoint of ensuring the electrical connection reliability, the shortest distance Z is preferably 10 to 30 μm. In the expression "the shortest distance Z between the internal electrodes adjacent to each other (a plurality of internal electrodes are provided on the semiconductor chip)", the term "shortest" is purposely used in order to express a distance between points which are closest to each other in the case where the distance Z between the internal electrodes which are adjacent to each other is not fixed.

The size of the first semiconductor chip 10 is preferably larger than that of the second semiconductor chip 20, but the present invention is not particularly limited thereto. From the viewpoint of improving the integration density of the semiconductor chips, as shown in FIG. 1(a), the semiconductor chip 20 is preferably provided on the approximate center area of the semiconductor chip 10. Further, the external electrode 12 which is provided on the semiconductor chip 10 is preferably provided on the marginal portion of the semiconductor chip 10.

The solder area 100 is an area in which a solder component is melted and fixed. The opposed internal electrodes are conducted via this area. The solder component to be used for the solder area 100 is not particularly limited, but for example, it is preferably an alloy comprising at least two substances selected from the group consisting of tin (Sn), silver (Ag), bismuth (Bi), indium (In), zinc (Zn) and copper (Cu). The use amount of the solder component to be used for the solder area 100 is not particularly limited as long as it is within the range in which the opposed internal electrodes can be conducted.

The insulating area 101 is an area filled with an insulating resin. The internal electrodes which are adjacent to each other are electrically insulated by this area. The insulating resin to be used for the insulating area 101 is preferably a curable resin from the viewpoint of enhancing the electrical connection strength and the mechanical adhesive strength. The use amount of the insulating resin to be used for the insulating area 101 is not particularly limited as long as it is within the range in which the internal electrodes which are adjacent to each other can be electrically insulated.

Materials, etc. to be used for the solder area 100 and the insulating area 101 will be described in detail in the item related to production method described later.

The thickness of each of the semiconductor chips 10 and 20 is preferably 10 to 1000 μm, and more preferably 750 μm or less, but the present invention is not particularly limited thereto. Further, the size and materials of the internal electrodes and external electrodes are not particularly limited, and can be suitably selected depending on the intended use. Regarding the semiconductor chips, internal electrodes, external electrodes, etc. to be used in the present invention, for example, the following descriptions can be referred to: "CSP-gijutsu No Subete Part 2 (All about CSP Technique Part 2)", written by Eiji Hagimoto, published by Kogyo Chosakai Publishing, Inc., pp. 62-72, 84-88 and 39-60; "SiP-gijutsu No Subete (All about SiP Technique)", written by Takashi Akazawa, published by Kogyo Chosakai Publishing, pp. 176-188 and 192-205; and Japanese Laid-Open Patent Publication No. 2004-63753.

Since this embodiment has the above-described constitution, the whole component to be packaged can be subjected to thickness and size reduction, and moreover, the whole component to be packaged can also be subjected to weight reduction.

Figure 2:
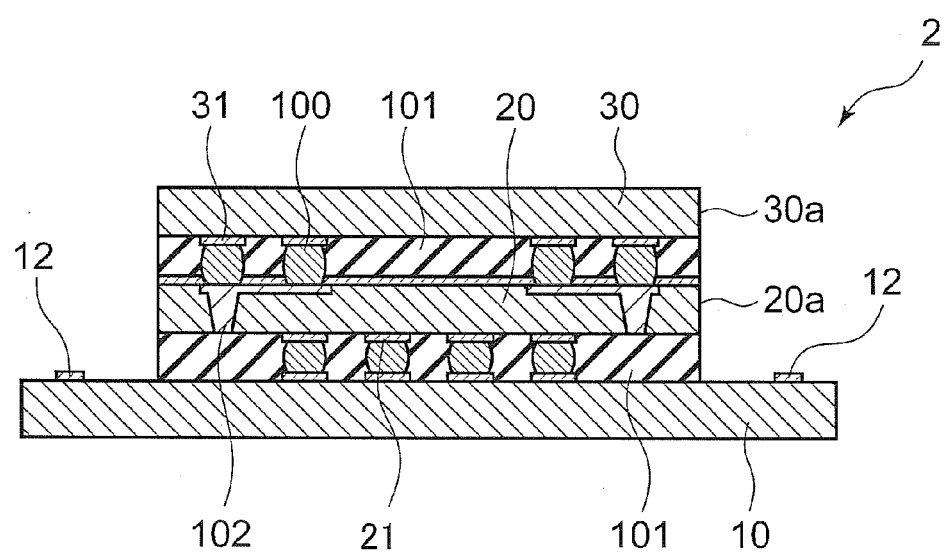
FIG. 2 shows a schematic cross sectional view of a multiple-layer stack type semiconductor electronic component according to one embodiment of the present invention.

In the present invention, a multiple-layer stack type semiconductor electronic component in which a semiconductor electronic component 1 is further laminated with other semiconductors may be constituted. FIG. 2 shows a schematic cross sectional view of a multiple-layer stack type semiconductor electronic component according to one embodiment of the present invention.

As shown in FIG. 2, on the surface opposite to the circuit surface of the semiconductor chip 20 on which the internal electrodes 21 are provided, a semiconductor chip 30 on which internal electrodes 31 are provided is provided to constitute a multiple-layer stack type semiconductor electronic component 2.

The internal electrodes 31 which are provided on the circuit surface of the semiconductor chip 30 are conducted to the circuit surface of the semiconductor chip 20 by the solder area 100 via through-holes 102 provided in the thickness direction of the semiconductor chip 20, and are electrically connected to the internal electrodes 21 on the semiconductor chip 20. In this regard, the through-holes 102 are formed, for example, by forming through holes in the thickness direction of the semiconductor chip 20 by means of drilling or the like, applying plating to inner wall surfaces of the through holes and filling the plated through holes with resin. Regarding through holes, for example, the following descriptions can be referred to: Japanese Laid-Open Patent Publication No. 2001-127243; and Japanese Laid-Open Patent Publication No. 2002-026241. The gap between the semiconductor chip 20 and the semiconductor chip 30 is filled with an insulating resin to form an insulating area 101. By the insulating area 101, internal electrodes which are adjacent to each other are electrically insulated.

Thus, according to this embodiment, semiconductor chips can be mounted in a multiple-layer form. The distance between the semiconductor chip 20 and the semiconductor chip 30 is preferably within the same range as that of the distance X between the semiconductor chip 10 and the semiconductor chip 20, but the present invention is not particularly limited thereto. Further, the shortest distance between the side surface 30a of the semiconductor chip 30 and the external electrode 12 provided on the circuit surface of the semiconductor chip 10 is preferably within the same range as that of the shortest distance Y between the side surface 20a of the semiconductor chip 20 and the external electrode 12 provided on the circuit surface of the semiconductor chip 10. Moreover, the shortest distance between the internal electrodes adjacent to each other (a plurality of internal electrodes are provided on the circuit surface of the semiconductor chip 30) is preferably within the same range as that of the shortest distance Z between the internal electrodes adjacent to each other provided on the circuit surface of the semiconductor chip 10 or 20.

2. Method for Producing a Semiconductor Electronic Component

Figure 3:
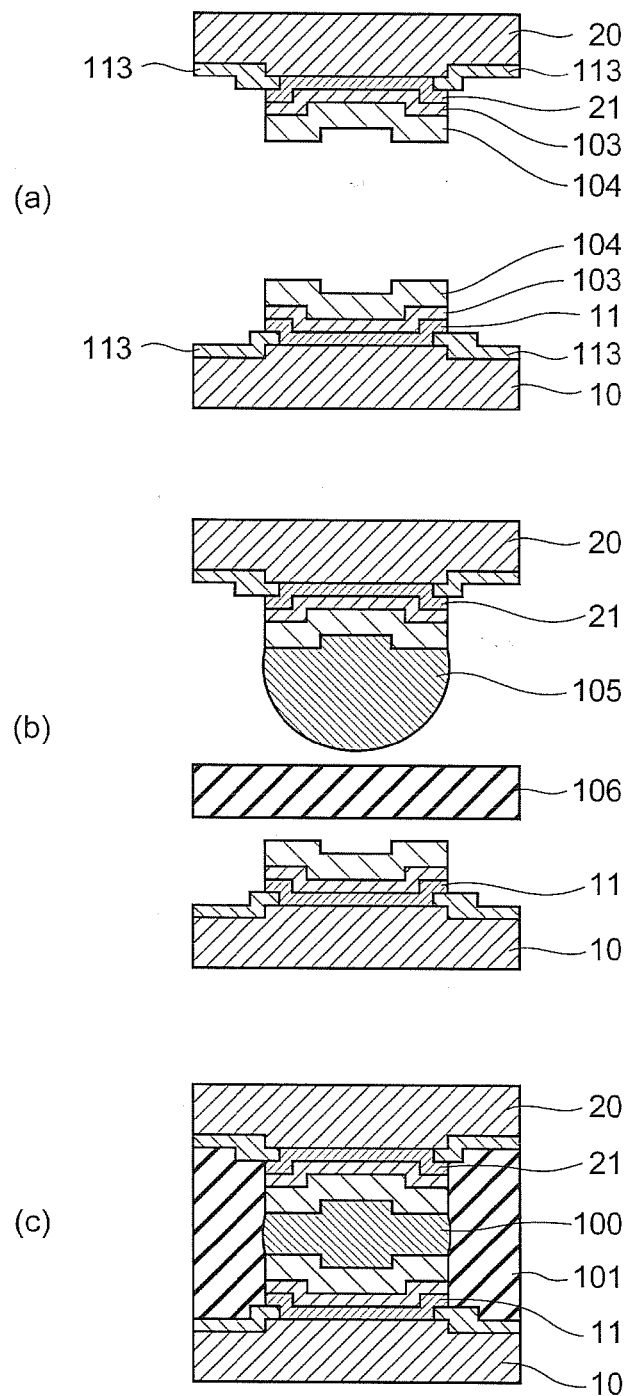
FIG. 3 shows explanatory drawings for steps in a method for producing a semiconductor electronic component according to one embodiment of the present invention.
Figure 4:
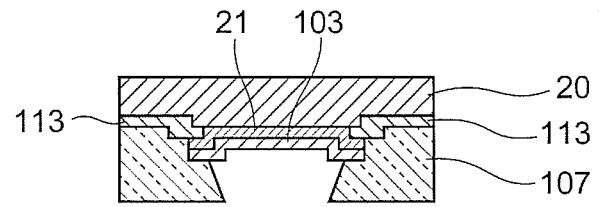
FIG. 4 shows explanatory drawings for steps in a method for producing a semiconductor electronic component according to one embodiment of the present invention.
Figure 4:
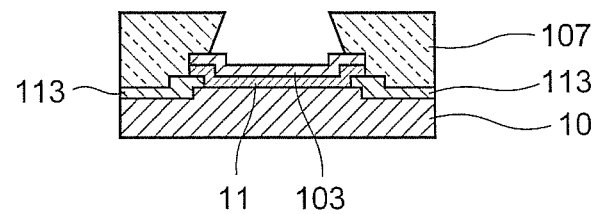
Figure 4:
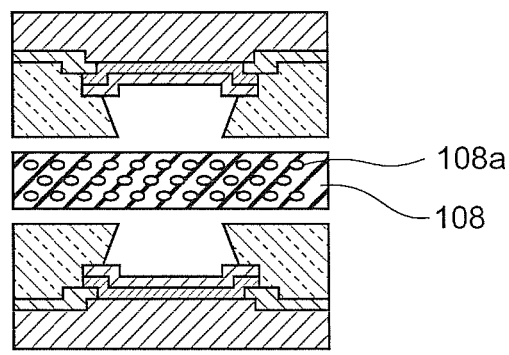
Figure 4:
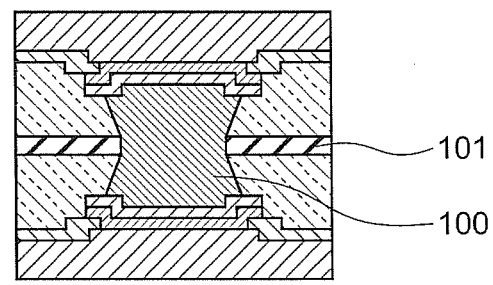

Next, a method for producing a semiconductor electronic component according to one embodiment of the present invention will be described with reference to FIGS. 3 and 4. FIG. 3 shows explanatory drawings for steps in a method for producing a semiconductor electronic component according to one embodiment of the present invention (the first embodiment), and FIG. 4 shows explanatory drawings for steps in a method for producing a semiconductor electronic component according to another embodiment of the present invention (the second embodiment).

(1) First Embodiment

Firstly, a method of producing a semiconductor electronic component according to the first embodiment of the present invention will be described with reference to FIG. 3.

As shown in FIG. 3(a), firstly, a semiconductor chip 10 in which an internal electrode 11 is provided on a circuit surface thereof and a semiconductor chip 20 in which an internal electrode 21 is provided on a circuit surface thereof are prepared. In order to obtain good electrical connection, surfaces of the internal electrodes 11 and 21 may be subjected to treatment such as washing, polishing, plating and surface activation in advance. For example, as shown in FIG. 3(a), UBM (Under Barrier Metal) layers 103 and 104 may be formed on the surfaces of the internal electrodes 11 and 21 using Ti, Ti/Cu, Cu, Ni, Cr/Ni or the like. One or more UBM layers may be formed. The surfaces of the semiconductor chips 10 and 20 may be subjected to surface stabilization treatment in advance for the purpose of protecting a semiconductor element. For example, a passivating layer 113 (e.g., SiN film) may be formed. Further, as a layer for releasing residual stress present in the joint portion between a solder bump and the UBM layer and the internal electrode, an organic resin protecting layer such as a polyimide film, a polybenzooxazol film and a benzocyclobutene film may be formed (not shown).

Next, as shown in FIG. 3(b), a solder bump 105 is formed on at least one of the internal electrodes 11 and 21. The solder bump 105 may be formed by means of a plating method or a solder paste printing method. In FIG. 3(a), the solder bump 105 is formed on the internal electrode 21, but it may be formed only on the internal electrode 11, and it may be formed on both the internal electrodes 11 and 21. The solder bump 105 may be subjected to reflow process after it is formed.

A solder component constituting the solder bump 105 is preferably an alloy comprising at least two substances selected from the group consisting of tin (Sn), silver (Ag), bismuth (Bi), indium (In), zinc (Zn) and copper (Cu). Among these substances, alloys containing Sn such as Sn—Bi alloy, Sn—Ag—Cu alloy and Sn—In alloy are preferred in view of melting temperature and mechanical properties. The melting point of the solder bump is generally 100° C. or higher, and preferably 130° C. or higher from the viewpoint of ensuring sufficient flowability of a resin component in a thermosetting adhesive film. Further, the melting temperature of the solder bump is generally 250° C. or lower, and preferably 230° C. or lower from the viewpoint of preventing heat deterioration of an element provided on a circuit board or a semiconductor chip at the time of adhesion. An endothermic peak temperature, which is obtained when measuring solder powder alone constituting the solder bump with the rate of temperature increase of 10° C./min using DSC or the like, is regarded as the melting point of the solder bump.

Regarding the size of the solder bump 105, the diameter thereof is preferably 5 to 500 μm, more preferably 10 to 300 μm, and even more preferably 20 to 200 μm from the viewpoint of ensuring sufficient electrical connection reliability.

Next, as shown in FIG. 3(c), a thermosetting adhesive film 106 comprising a flux compound is interposed between the semiconductor chip 10 and the semiconductor chip 20, and it is heated to a temperature at which curing of the thermosetting adhesive film 106 is not completed and the solder bump 105 is melted. By heating, the solder component constituting the solder bump 105 is melted, and the melted solder component is aggregated on the surface of the internal electrode. Further, the surface of the internal electrode and the solder component are joined together to form a solder area 100, and thereby internal electrodes opposed to each other are electrically connected.

When the thickness of the thermosetting adhesive film is set as 100 μm, the melt viscosity of the thermosetting adhesive film at the melting point of the solder bump is preferably 50 to 5000 Pa·s, and more preferably 100 to 4000 Pa·s. When the melt viscosity of the thermosetting adhesive film at the melting point of the solder bump is within the above-described range, diffusion of the solder component between the internal electrodes can be suppressed, and bleeding of the resin component can be suppressed. For the purpose of preventing heat deterioration of the semiconductor electronic component, the curing temperature of the thermosetting adhesive film is preferably lower than 250° C. The melt viscosity of the thermosetting adhesive film can be measured using a sample in which the thickness of the adhesive film is 100 μm and a dynamic viscoelasticity measurement apparatus with the frequency of 0.1 Hz and the rate of temperature increase of 10° C./min.

At the time point when the heating temperature reaches the melting point of the solder bump, the distance between the internal electrodes opposed to each other may be decreased by applying pressure on the semiconductor chips 10 and 20.

Thus, the solder component melted by heating is aggregated between the internal electrodes opposed to each other and is fixed to form the solder area 100 as shown in FIG. 3(c), and thereby the internal electrodes opposed to each other are electrically connected. Meanwhile, the gap between the semiconductor chip 10 and the semiconductor chip 20 is filled with a resin component contained in the thermosetting adhesive film 106, and thus the resin component forms an insulating area 101. The internal electrodes adjacent to each other are electrically insulated by the insulating area 101.

Next, the resin component of the thermosetting adhesive film 106 is completely cured to ensure electrical connection strength and mechanical adhesive strength. According to this embodiment, the internal electrodes opposed to each other are electrically connected in this way, and the gap between the semiconductor chip 10 and the semiconductor chip 20 can be sealed with the insulating resin.

(a) Flux Compound

In this regard, the thermosetting adhesive film 106 includes a flux compound. In the resin component, the flux compound efficiently moves to the interface between the internal electrode and the solder bump. The flux compound removes an oxidized film on the surface of the solder bump 105, and thereby wettability of the solder bump can be improved. As a result, the connection resistance value between the internal electrodes opposed to each other can be reduced. When using such a flux compound, the step of washing flux can be omitted. As a result, the manufacturing process can be simplified.

Examples of flux compounds include compounds comprising a phenolic hydroxyl group or a carboxyl group, etc.

Examples of phenolic hydroxyl group-containing compounds include: monomers containing a phenolic hydroxyl group such as phenol, o-cresol, 2,6-xylenol, p-cresol, m-cresol, o-ethylphenol, 2,4-xylenol, 2,5-xylenol, m-ethylphenol, 2,3-xylenol, mesitol, 3,5-xylenol, p-tertiary butyl phenol, catechol, p-tertiary amylphenol, resorcinol, p-octylphenol, p-phenylphenol, bisphenol F, bisphenol F, bisphenol AF, biphenol, diallyl bisphenol F, diallyl bisphenol A, trisphenol and tetrakisphenol; phenol novolac resin; o-cresol novolac resin; bisphenol F novolac resin; and bisphenol A novolac resin.

Examples of carboxyl group-containing compounds include aliphatic acid anhydride, alicyclic acid anhydride, aromatic acid anhydride, aliphatic carboxylic acid, aromatic carboxylic acid and phenols.

Examples of aliphatic acid anhydrides include succinic anhydride, polyadipic acid anhydride, polyazelaic acid anhydride and polysebacic acid anhydride.

Examples of alicyclic acid anhydrides include methyltetrahydrophthalic anhydride, methylhexahydrophthalic anhydride, methyl himic anhydride, hexahydrophthalic anhydride, tetrahydrophthalic anhydride, trialkyltetrahydrophthalic anhydride, and methylcyclohexenedicarboxylic anhydride.

Examples of aromatic acid anhydrides include phthalic anhydride, trimellitic anhydride, pyromellitic anhydride, benzophenone tetracarboxylic anhydride, ethylene glycol bistrimellitate and glycerol tristrimellitate.

Examples of aliphatic carboxylic acids include formic acid, acetic acid, propionic acid, butyric acid, valeric acid, pivalic acid, caproic acid, caprylic acid, lauric acid, myristic acid, palmitic acid, stearic acid, acrylic acid, methacrylic acid, crotonic acid, oleic acid, fumaric acid, maleic acid, oxalic acid, malonic acid, succinic acid, glutaric acid, adipic acid, sebacic acid, dodecanedione acid, and pimelic acid. Among the above-described substances, aliphatic carboxylic acids represented by HOOC—$(CH_2)_n$—COOH (n is an integer from 0 to 20) are preferred. For example, adipic acid, sebacic acid and dodecanedione acid are preferred.

Examples of aromatic carboxylic acids include: naphthoic acid derivatives such as benzoic acid, phthalic acid, isophthalic acid, terephthalic acid, hemimellitic acid, trimellitic acid, trimesic acid, mellophanic acid, prehnitic acid, pyromellitic acid, mellitic acid, triyl acid, xylic acid, hemellitic acid, mesitylene acid, prehnitylic acid, toluic acid, cinnamic acid, salicylic acid, 2,3-dihydroxybenzoic acid, 2,4-dihydroxybenzoic acid, gentisic acid (2,5-dihydroxybenzoic acid), 2,6-dihydroxybenzoic acid, 3,5-dihydroxybenzoic acid, gallic acid (3,4,5-trihydroxybenzoic acid), 4-dihydroxy-2-naphthoic acid, 3,5-dihydroxy-2-naphthoic acid, and 3,5-2-dihydroxy-2-naphthoic acid; phenolphthalin; and diphenolic acid.

Among the above-described substances, compounds which can act as a curing agent for the resin component of the thermosetting adhesive film are preferred. That is, the flux compound to be used in this embodiment preferably exerts effect of reducing the oxidized film on the surface of the solder bump to the extent that the film can be electrically connected with a conductive member, and preferably has a functional group which binds to the resin component (i.e., a curing agent having flux activity). At the time of melting the thermosetting adhesive film, the curing agent having flux activity reduces the oxidized film on the surface of the solder bump to improve wettability of the solder component constituting the solder bump and promote aggregation of the solder component to the portion between the internal electrodes opposed to each other in the semiconductor chip, and thereby facilitating formation of the solder area. Meanwhile, after electrical connection between the semiconductor chips is formed, the function as the curing agent is exerted, and by addition to the resin, the coefficient of elasticity or Tg of the resin can be increased. By using the above-described curing agent having flux activity, generation of ion migration caused by flux residue can be suppressed without the necessity of flux washing.

The curing agent having flux activity to be used in the present invention preferably has at least one carboxyl group. The functional group which binds to the resin component contained in the curing agent having flux activity can be suitably selected depending on the type and the like of the curable resin to be used. For example, when an epoxy resin is contained in the resin component, the curing agent having flux activity may have a carboxyl group and a group which reacts with an epoxy group (e.g., carboxyl group, hydroxyl group and amino group).

Specifically, the curing agent having flux activity to be used in the present invention is preferably at least one substance selected from the group consisting of aliphatic dicarboxylic acid and compounds having a carboxyl group and a phenolic hydroxyl group.

The aliphatic dicarboxylic acid to be used in the present invention is not particularly limited as long as it is a compound in which two carboxyl groups bind to aliphatic hydrocarbon. The aliphatic hydrocarbon group may be saturated or unsaturated acyclic, or may be saturated or unsaturated cyclic. When the aliphatic hydrocarbon group is acyclic, it may be linear or branched.

Examples of the aliphatic dicarboxylic acids include a compound represented by the following formula (1):

$$\text{HOOC—}(CH_2)_n\text{—COOH} \quad (1)$$

In the formula, n is an integer from 1 to 20, and preferably an integer from 3 to 10. Within this range, flux activity, outgas at the time of adhesion, and the balance between the coefficient of elasticity and glass transition temperature after the thermosetting adhesive film is cured are favorable. In particular, when n is 3 or higher, increase of the coefficient of elasticity after the thermosetting adhesive film is cured can be suppressed, and the ability to adhere to a product can be improved. Further, when n is 10 or lower, decrease of coefficient of elasticity can be suppressed, and connection reliability can be further improved.

Specific examples of the compounds represented by the above-described formula (1) include glutaric acid, adipic acid, pimelic acid, suberic acid, azelaic acid, sebacic acid, undecanedioic acid, dodecanedioic acid, tridecanedioic acid, tetradecanedioic acid, pentadecanedioic acid, octadecanedioic acid, nonadecanedioic acid, and eicosanedioic acid. Among the above-described substances, adipic acid, suberic acid, sebacic acid, and dodecanedioic acid are preferred, and sebacic acid is particularly preferred.

Examples of compounds having a carboxyl group and a phenolic hydroxyl group include: benzoic acid derivatives such as salicylic acid, 2,3-dihydroxybenzoic acid, 2,4-dihydroxybenzoic acid, gentisic acid (2,5-dihydroxybenzoic acid), 2,6-dihydroxybenzoic acid, 3,4-dihydroxybenzoic acid, and gallic acid (3,4,5-trihydroxybenzoic acid); naphthoic acid derivatives such as 1,4-dihydroxy-2-naphthoic acid and 3,5-dihydroxy-2-naphthoic acid; phenolphthalin; and diphenolic acid. Among the above-described substances, phenolphthalin, gentisic acid, 2,4-dihydroxybenzoic acid and 2,6-dihydroxybenzoic acid are preferred, and phenolphthalin, gentisic acid or a combination thereof is particularly preferred.

Any of these compounds has high moisture absorption and causes voids. Therefore, such a compound is preferably dried before use.

In the present invention, the curing agents having flux activity may be used solely or in combination.

The content of the flux compound is preferably 0.1 to 30 wt %, more preferably 1 to 20 wt %, even more preferably 3 to 18 wt %, and particularly preferably 5 to 15 wt % with respect to the total amount of the constituents of the thermosetting adhesive film. Within this range, the oxidized film on the surface of the solder bump can be sufficiently reduced to the extent that it can be electrically connected. Further, at the time of curing the resin component, the flux compound can be efficiently added to the resin to increase the coefficient of elasticity or Tg of the resin. Moreover, generation of ion migration caused by an unreacted flux compound can be suppressed.

(b) Resin Component

The thermosetting adhesive film to be used in the present invention comprises a resin component as well as the flux compound. The resin component to be used preferably comprises a thermosetting resin and a thermoplastic resin because desired film-forming ability and melt viscosity can be obtained thereby.

Examples of thermosetting resins include epoxy resin, oxetane resin, phenol resin, (meth)acrylate resin, unsaturated polyester resin, diallyl phthalate resin, and maleimide resin. Among them, epoxy resin is preferably used because it has good curability and preservation property, and heat resistance, moisture resistance and chemical resistance of a cured product are excellent.

Examples of thermoplastic resins include phenoxy resin, polyester resin, polyurethane resin, polyimide resin, siloxane-modified polyimide resin, polybutadiene, polypropylene, styrene-butylene-styrene copolymer, polyacetal resin, polyvinyl butyral resin, polyvinyl acetal resin, butyl rubber, chloroprene rubber, polyamide resin, acrylonitrile-butadiene copolymer, acrylonitrile-butadiene-acrylic acid copolymer, acrylonitrile-butadiene-styrene copolymer, polyvinyl acetate, nylon, and (meth)acrylic resin (including acrylic rubber). For the purpose of improving adhesion property and compatibility with other resins, resins having a nitrile group, epoxy group, hydroxyl group or carboxyl group are preferably used. Particularly preferably, (meth)acrylic resins are used.

For example, when using an epoxy resin as the thermosetting resin, the content of the epoxy resin is preferably 20 to 80 wt % with respect to the total amount of the constituents of the thermosetting adhesive film. When using a (meth)acrylic resin as the thermoplastic resin, the content of the (meth) acrylic resin is preferably 10 to 50 wt % with respect to the total amount of the constituents of the thermosetting adhesive film.

More specifically, the thermosetting adhesive film to be used in the present invention preferably comprises a film-forming resin and a curable resin as resin components.

(Film-Forming Resin)

The film-forming resin to be used in the present invention is not particularly limited as long as it can be solved in an organic solvent and independently has film-forming ability. As the film-forming resin, a thermoplastic resin or a thermosetting resin can be used solely, or they can be used in combination.

Examples of the film-forming resins include (meth)acrylic resin, phenoxy resin, polyester resin, polyurethane resin, polyimide resin, siloxane-modified polyimide resin, polybutadiene, polypropylene, styrene-butadiene-styrene copolymer, styrene-ethylene-butylene-styrene copolymer, polyacetal resin, polyvinyl butyral resin, polyvinyl acetal resin, butyl rubber, chloroprene rubber, polyamide resin, acrylonitrile-butadiene copolymer, acrylonitrile-butadiene-acrylic acid copolymer, acrylonitrile-butadiene-styrene copolymer, polyvinyl acetate, and nylon. These substances can be used solely or in combination. In particular, the film-forming resin is preferably at least one substance selected from the group consisting of (meth)acrylic resin, phenoxy resin and polyimide resin.

As used herein, the term "(meth)acrylic resin" refers to polymers of (meth)acrylic acid and derivatives thereof or a copolymer of (meth)acrylic acid or a derivative thereof and another monomer. In this regard, when describing "(meth) acrylic acid" or the like, it means acrylic acid or methacrylic acid.

Examples of (meth)acrylic resins include: polyacrylic acid; polymethacrylic acid; polyacrylic acid esters such as poly(methyl acrylate), poly(ethyl acrylate), poly(butyl acrylate), and 2-ethylhexyl-polyacrylate; polymethacrylic acid esters such as poly(methyl methacrylate), poly(ethyl methacrylate), and poly(butyl methacrylate); polyacrylonitrile; polymethacrylonitrile; polyacrylamide; butyl acrylate-ethyl acrylate-acrylonitrile copolymer; acrylonitrile-butadiene copolymer; acrylonitrile-butadiene-acrylic acid copolymer; acrylonitrile-butadiene-styrene copolymer; acrylonitrile-styrene copolymer; methyl methacrylate-styrene copolymer; methyl methacrylate-acrylonitrile copolymer; methyl methacrylate-α-methylstyrene copolymer; butyl acrylate-ethyl acrylate-acrylonitrile-2-hydroxyethyl methacrylate-methacrylic acid copolymer; butyl acrylate-ethyl acrylate-acrylonitrile-2-hydroxyethyl methacrylate-acrylic acid copolymer; butyl acrylate-acrylonitrile-2-hydroxyethyl methacrylate copolymer; butyl acrylate-acrylonitrile-acrylic acid copolymer; butyl acrylate-ethyl acrylate-acrylonitrile copolymer; and ethyl acrylate-acrylonitrile-N,N-dimethylacrylamide copolymer. Among them, butyl acrylate-ethyl acrylate-acrylonitrile copolymer and ethyl acrylate-acrylonitrile-N,N-dimethylacrylamide are preferred.

When using a (meth)acrylic resin in which a monomer having a functional group (e.g., nitrile group, epoxy group, hydroxyl group and carboxyl group) is copolymerized, the ability to adhere to a product and compatibility with other resin components can be improved. In the case of such a (meth)acrylic resin, the use amount of the monomer having the functional group is not particularly limited, but is preferably 0.1 to 50 mol %, more preferably 0.5 to 45 mol %, and even more preferably 1 to 40 mol % with respect to the total weight of the (meth)acrylic resin. When the blending amount is less than the lower limit, the effect of improving adhesion may be reduced. When the amount exceeds the upper limit, adhesion is too strong and it may cause reduction in the effect of improving workability.

The weight average molecular weight of the (meth)acrylic resin is not particularly limited, but is preferably 100,000 or more, more preferably 150,000 to 1,000,000, and even more preferably 250,000 to 900,000. When the weight average molecular weight is within the above-described range, film-forming ability can be improved.

When using a phenoxy resin as the film forming resin, the number average molecular weight thereof is preferably 5,000 to 15,000, more preferably 6,000 to 14,000, and even more preferably 8,000 to 12,000. When using the phenoxy resin, flowability of the thermosetting adhesive film before cured can be suppressed, and the interlayer thickness of the thermosetting adhesive film can be equalized. Examples of skeletons of the phenoxy resin include, but are not limited to, bisphenol A type, bisphenol F type and biphenyl skeleton type. Among them, a phenoxy resin having the saturated water absorption rate of 1% or less is preferred because it can suppress generation of foam, peel-off or the like at a high temperature at the time of adhesive joining and solder mounting. With respect to the saturated water absorption rate: the phenoxy resin is processed to form a film having the thickness of 25 μm; the film is dried under the atmosphere of 100° C. for 1 hour (absolute dry); subsequently, the film is left in a constant-temperature zone with high humidity under the atmosphere of 40° C., 90% RH; the change of weight is measured every 24 hours; and using the weight at the time of saturation of change, the saturated water absorption rate can be calculated according to the following formula:

Saturated water absorption rate(%)={(Weight at the time of saturation)−(Weight at the time of absolute dry)}/(Weight at the time of absolute dry)× 100

The polyimide resin to be used in the present invention is not particularly limited as long as it has imide bond in a repeat unit. Examples thereof include those obtained by reacting diamine with acid dianhydride and heating the obtained polyamide acid to cause dehydration and ring closure. Examples of diamines include aromatic diamines (e.g., 3,3'-dimethyl-4,4'-diaminodiphenyl, 4,6-dimethyl-m-phenylenediamine, and 2,5-dimethyl-p-phenylenediamine), siloxanediamines (e.g., 1,3-bis(3-aminopropyl)-1,1,3,3-tetramethyldisiloxane), etc. These diamines can be used solely or in combination. Examples of acid dianhydrides include 3,3,4,4'-biphenyl tetracarboxylic acid, pyromellitic dianhydride, and 4,4'-oxydiphthalic dianhydride. These acid dianhydrides can be used solely or in combination. The polyimide resin may be soluble or insoluble in solvents. When the polyimide resin is soluble in solvents, varnish can be easily obtained at the time of mixing with other components and it is excellent in handleability. Siloxane-modified polyimide resin is particularly preferably used because it can be solved in various organic solvents.

As the film forming resin, a commercially-available product can be used. Further, additives such as plasticizers, stabilizers, inorganic fillers, antistatic agents and pigments may be blended therewith in a range in which the effects of the present invention are not reduced.

The blending amount of the film forming resin is 10 to 50 wt %, preferably 15 to 40 wt %, and more preferably 20 to 35 wt % with respect to the total amount of the constituents of the thermosetting adhesive film. Within this range, flowability of the resin component in the thermosetting adhesive film before melted can be suppressed, and therefore handleability of the thermosetting adhesive film can be improved.

(Curable Resin)

In general, the curable resin to be used in the present invention is not particularly limited as long as it can be used as an adhesive component for semiconductors. Examples of the curable resins include epoxy resin, oxetane resin, phenol resin, (meth)acrylate resin, unsaturated polyester resin, diallyl phthalate resin, and maleimide resin. Among them, epoxy resin is preferably used because it is excellent in curability and preservation property, and heat resistance, moisture resistance and chemical resistance of a cured product are excellent.

The epoxy resin to be used may be solid or liquid at room temperature. An epoxy resin which is solid at room temperature and an epoxy resin which is liquid at room temperature can be used in combination, and thereby melting behavior of resin can be more freely designed.

Examples of the epoxy resins which are solid at room temperature include bisphenol A type epoxy resins, bisphenol S type epoxy resins, phenol novolac type epoxy resins, cresol novolac type epoxy resins, glycidyl amine type epoxy resins, glycidyl ester type epoxy resins, trifunctional epoxy resins and tetrafunctional epoxy resins, but are not particularly limited thereto. More specifically, solid trifunctional epoxy resins, cresol novolac type epoxy resins, etc. are preferably used. These epoxy resins can be used solely or in combination.

The softening point of the epoxy resin which is solid at room temperature is preferably 40 to 120° C., more preferably 50 to 110° C., and even more preferably 60 to 100° C. Within this range, tackiness of the thermosetting adhesive film can be suppressed, and therefore handleability of the thermosetting adhesive film can be improved.

Examples of the epoxy resins which are liquid at room temperature include bisphenol A type epoxy resins and bisphenol F type epoxy resins, but are not particularly limited thereto. Further, a bisphenol A type epoxy resin and a bisphenol F type epoxy resin may be used in combination.

The epoxy equivalent of the epoxy resin which is liquid at room temperature is preferably 150 to 300, more preferably 160 to 250, and even more preferably 170 to 220. When the epoxy equivalent is lower than the lower limit of the range, the shrinkage ratio of a cured product tends to be increased. In this case, there is a possibility of generation of a warpage of the semiconductor chip adhered using the thermosetting adhesive film. When the epoxy equivalent is higher than the upper limit of the range, the reactivity with the film forming resin (in particular, the polyimide resin) may be decreased.

As the curable resin such as epoxy resin, a commercially available product can be used. Further, additives such as plasticizers, stabilizers, inorganic fillers, antistatic agents and pigments may be blended therewith in a range in which the effects of the present invention are not reduced.

The blending amount of the curable resin is 30 to 80 wt %, preferably 35 to 75 wt %, and even more preferably 40 to 70 wt % with respect to the total amount of the constituents of the thermosetting adhesive film. Within this range, electrical connection strength and mechanical adhesive strength between semiconductor chips can be ensured.

(c) Curing Agent

Curing agents other than those having flux activity (e.g., phenol resin) may be further blended in the thermosetting adhesive film. Examples thereof include phenols, amines and thiols. These substances may be suitably selected depending on the type, etc. of the curable resin used. For example, when using epoxy resin as the curable resin, as the curing agent, phenols are suitably used from the viewpoint of good reactivity with epoxy resin, small change in size at the time of curing, and suitable physical properties after curing (e.g., heat resistance and moisture resistance).

The phenols to be used in the present invention are not particularly limited, but are preferably bifunctional or higher because of excellent physical properties of the thermosetting adhesive film after curing. Examples thereof include bisphenol A, tetramethyl bisphenol A, diallyl bisphenol A, biphenol, bisphenol F, diallyl bisphenol F, trisphenol, tetrakisphenol, phenol novolacs, and cresol novolacs. Among them, phenol novolacs and cresol novolacs are preferably used because they have good melt viscosity and reactivity with epoxy resin and have excellent physical properties after curing.

The blending amount of the curing agent may be suitably selected depending on the types of the curable resin and curing agent used or the type and use amount of the curing agent having flux activity. For example, when using a phenol novolac as the curing agent, the blending amount thereof is preferably 5 wt % or more, and more preferably 10 wt % or more with respect to the total amount of the constituents of the thermosetting adhesive film on the point that the curable resin can be surely cured. When phenol novolacs which are unreacted with epoxy resin remain, they cause ion migration. In order to prevent residues thereof, the amount is preferably 50 wt % or less, more preferably 30 wt % or less, and even more preferably 25 wt % or less.

The blending amount of phenol novolac resin may be defined with the equivalent ratio with respect to epoxy resin. For example, the equivalent ratio of phenol novolac resin to epoxy resin is 0.5 to 1.2, preferably 0.6 to 1.1, and more preferably 0.7 to 0.98. When the equivalent ratio of phenol novolac resin to epoxy resin is 0.5 or more, heat resistance and moisture resistance after curing can be ensured. When the equivalent ratio is 1.2 or less, the amount of the remaining phenol novolac resin unreacted with epoxy resin after curing can be decreased, leading to good ion migration resistance.

These curing agents can be used solely or in combination.

(d) Curing Accelerator

The thermosetting adhesive film may further include a curing accelerator. The curing accelerator can be suitably selected depending on the type of resin. For example, imidazole compounds having a melting point of 150° C. or higher can be used. When the melting point of the curing accelerator used is 150° C. or higher, the solder component can move to the surfaces of the internal electrodes before curing of the thermosetting adhesive film is completed, leading to good connection between the internal electrodes. Examples of imidazole compounds having a melting point of 150° C. or higher include 2-phenylhydroxyimidazole and 2-phenyl-4-methylhydroxyimidazole.

The blending amount of the curing accelerator can be suitably selected. For example, when using an imidazole compound as the curing accelerator, the amount thereof is preferably about 0.005 to 10 wt %, and more preferably about 0.01 to 5 wt % with respect to the total amount of the constituents of the thermosetting adhesive film 106. When the blending amount of the imidazole compound is 0.005 wt % or more, the function as the curing accelerator can be more effectively exerted, and thereby the curability of the thermosetting adhesive film can be improved. When the blending amount of imidazole is 10 wt % or less, the melt viscosity of resin at the melting temperature of the solder component constituting the solder bump is not too high, and therefore good solder junction structure can be obtained. Moreover, preservation property of the thermosetting adhesive film can be further improved.

These curing accelerators can be used solely or in combination.

(e) Silane Coupling Agent

The thermosetting adhesive film can further include a silane coupling agent. When including the silane coupling agent, adhesiveness of the adhesive film to the semiconductor chip can be improved. Examples of the silane coupling agents include an epoxysilane coupling agent and an aromatic ring-containing aminosilane coupling agent. These substances can be used solely or in combination. The blending amount of the silane coupling agent can be suitably selected, but is preferably 0.01 to 5 wt %, more preferably 0.01 to 5 wt %, even more preferably 0.05 to 5 wt %, and particularly preferably 0.1 to 2 wt % with respect to the total amount of the constituents of the thermosetting adhesive film.

In addition to the above-described components, various additives may be suitably blended in the thermosetting adhesive film to be used in this embodiment for the purpose of improving various properties such as compatibility and stability of resin and workability.

These components are mixed in a solvent, and varnish thus obtained is applied on a substrate subjected to release treatment such as a polyester sheet. This is dried at a predetermined temperature to the extent that no solvent is substantially included, and thereby the thermosetting adhesive film 106 is obtained. The solvent to be used is not particularly limited as long as it is inactive with respect to the components to be used. Examples of preferred solvents include: ketones such as acetone, methyl ethyl ketone, methyl isobutyl ketone, DIBK (diisobutyl ketone), cyclohexanone and DAA (diacetone alcohol); aromatic hydrocarbons such as benzene, xylene and toluene; alcohols such as methyl alcohol, ethyl alcohol, isopropyl alcohol and n-butyl alcohol; cellosolve-based substances such as methyl cellosolve, ethyl cellosolve, butyl cellosolve, methyl cellosolve acetate and ethyl cellosolve acetate; NMP (N-methyl-2-pyrrolidone); THF (tetrahydrofuran); DMF (dimethylformamide); DBE (dibasic ester); EEP (ethyl 3-ethoxypropionate); and DMC (dimethyl carbonate). The use amount of the solvent is preferably within the range in which the solid content in the components mixed in the solvent is 10 to 60 wt %.

The thickness of the thermosetting adhesive film 106 is not particularly limited, but is preferably 1 to 50 μm, and more preferably 3 to 30 μm. Within this range, the gap between the semiconductor chips can be sufficiently filled with the resin component. Therefore, after the resin component is cured, the mechanical adhesive strength can be ensured. Moreover, electrical connection between the internal electrodes opposed to each other can be ensured. Therefore, a desired distance between the semiconductor chips can be obtained. The size of the thermosetting adhesive film 106 is suitably adjusted at the time of use depending on the size of coating on the bonding surface between the semiconductor chip 10 and the semiconductor chip 20. In consideration of adhesiveness, etc., it is desired that the size of the film 106 is larger than at least half the size of the semiconductor chip.

In addition, the thermosetting adhesive film 106 preferably has a desired solder wet-spreading ratio (%). That is, when a tin-containing solder ball having the diameter of 500 μm is provided on the thermosetting adhesive film 106 and it is heated for 20 seconds at a temperature which is 30° C. higher than the melting point of the solder ball, the solder wet-spreading ratio of the thermosetting adhesive film represented by the following formula (I) is preferably 40% or higher:

$$\text{Solder wet-spreading ratio}(\%)=[\{(\text{diameter of solder ball})-(\text{thickness of solder after wet spreading})\}/(\text{diameter of solder ball})]\times 100 \quad (I)$$

In the case where a circuit substrate is subjected to metal joining using a solder bump, the higher the solder wet-spreading ratio, the stronger the intermetallic bond, and therefore joint strength is increased. When the solder wet-spreading ratio is 40% or higher, it is sufficient to prevent generation of defective joint. However, in consideration of increase in probability of joining and joining reliability under various circumstances after joining, the solder wet-spreading ratio is more preferably 45% or higher, and even more preferably 50% or higher.

When the solder wet-spreading ratio is 60% or higher, the aforementioned flux compound preferably contains aliphatic dicarboxylic acid. That is because, when the solder wet-spreading ratio is 60% or higher and therefore strong reducing power is required, it is desirable that electrical connection reliability is ensured by improving wettability of the solder component using aliphatic dicarboxylic acid, which has higher flux activity.

Meanwhile, when the solder wet-spreading ratio is 40 to 60%, the flux compound preferably contains a compound having a carboxyl group and a phenolic hydroxyl group. That is because, when the solder wet-spreading ratio is within the above-described range and reducing power required is not so strong, it is desirable that generation of ion migration caused by flux residue can be more effectively suppressed using a compound which is highly reactive with the curable resin (e.g., epoxy resin).

Regarding conditions for measuring the solder wet-spreading ratio, in order to reduce variation of the degree of wet-spreading of the solder ball, heating is performed at a temperature which is 30° C. higher than the melting point of the solder ball. Further, in consideration of time required for melting of the flux compound, migration thereof to the surface of the solder ball and wet-spreading of solder and variation of the degree of wet-spreading of solder, heating time is set as 20 seconds.

The solder wet-spreading ratio is specifically obtained using the following measurement method.
(1) To a bare Cu plate (manufactured by Hirai Seimitsu Kogyo Co., Ltd.), a thermosetting adhesive film having the thickness of 15 μm is attached.
(2) On the thermosetting adhesive film, the following solder balls having the diameter of 500 μm are stationarily placed.
(i) "M31" (Sn/Ag/Cu, melting point: 217° C., manufactured by Senju Metal Industry Co., Ltd.)
(ii) "L20" (Sn/Bi, melting point: 138° C., manufactured by Senju Metal Industry Co., Ltd.)
(3) Based on ASTM B 545, a hot plate is heated to a temperature which is 30° C. higher than the melting point of each of the solders, and the above-described sample is heated on the hot plate for 20 seconds.
(4) The height of the solder balls wet-spread on the bare Cu plate is measured.
(5) The solder wet-spreading ratio is calculated using the following formula (I):

Solder wet-spreading ratio(%)=[{(diameter of solder ball)−(thickness of solder after wet spreading)}/(diameter of solder ball)]×100  (I)

When the thickness is 100 μm, the melt viscosity of the thermosetting adhesive film 106 at 223° C. is preferably 10 to 200000 Pa·s. When the melt viscosity is 10 Pa·s or higher, reduction in connection reliability and contamination of surrounding members caused by bleeding of the thermosetting adhesive film 106 from the semiconductor chip (adherend) when heating can be suppressed. In addition, defects such as generation of air bubbles and insufficient filling of the resin component in the gap between the semiconductor chips can be prevented. Moreover, it is possible to prevent the problem of shorting out between adjacent electrodes caused by too much wet-spreading of solder. When the melt viscosity is 200000 Pa·s or less, at the time of metal joining of the solder bump and the internal electrode provided on the semiconductor chip, resin between the solder bump and the internal electrode is removed, and therefore generation of defective joint can be suppressed. The melt viscosity is more preferably 10 to 10000 Pa·s, even more preferably 50 to 5000 Pa·s, and particularly preferably 300 to 1500 Pa·s.

The melt viscosity of the thermosetting adhesive film 106 is obtained using the following measurement method. That is, the thermosetting adhesive film having the thickness of 100 μm is subjected to measurement using a viscoelasticity measuring apparatus (JASCO International Co., Ltd.) (rate of temperature increase: 30° C./min, frequency: 1.0 Hz, measuring stress by constant distortion), and the viscosity at the atmospheric temperature of 223° C., which is the melting point of Sn/Ag (=96.5/3.5), is regarded as a measurement value.

(2) Second Embodiment

Next, a method of producing a semiconductor electronic component according to the second embodiment of the present invention will be described with reference to FIG. 4.

As shown in FIG. 4(a), a semiconductor chip 10 on which an internal electrode 11 is provided and a semiconductor chip 20 on which an internal electrode 21 is provided are positioned so that the surfaces thereof on which the internal electrode is provided (circuit surfaces) are opposed to each other.

On the surface of the semiconductor chip 10 and the surface of the semiconductor chip 20, a protecting layer 107 may be formed in a way in which positions at the internal electrodes 11 and 21 are opened. For example, a protecting layer made of organic resin such as a polyimide film, a polybenzooxazol film and a benzocyclobutene film may by formed. This allows the solder component to be more easily introduced into the space between the internal electrodes opposed to each other, and good electrical connection between the internal electrodes can be provided. Further, the film can function as a stress relaxation layer. The form of the protecting layer 107 is not limited to the form shown in the drawing as long as it has the above-described functions. Further, the surfaces of the internal electrodes 11 and 21 may be subjected to treatment such as washing, polishing, plating and surface activation in advance. For example, as shown in FIG. 4(a), a UBM (Under Bump Metal) layer 103 may be formed on the surfaces of the internal electrodes 11 and 21 using Ti, Ti/Cu, Cu, Ni, Cr/Ni or the like. One or more UBM layers may be formed. The surfaces of the semiconductor chips 10 and 20 may be subjected to surface stabilization treatment in advance for the purpose of protecting a semiconductor element. For example, a passivating layer 113 (e.g., SiN film) may be formed.

Next, as shown in FIG. 4(b), a thermosetting adhesive film 108 is interposed between the semiconductor chip 10 and the semiconductor chip 20. The thermosetting adhesive film 108 includes solder powder 108a and a flux compound (not shown). The thermosetting adhesive film 108 is heated to a temperature at which curing of the film is not completed and the solder powder 108a in the film is melted. By heating, as shown in FIG. 4(c), the solder powder 108a is melted, moves through the resin component and aggregates on the surfaces of the internal electrodes in a self-aligning manner to form a solder area 100, and thereby the surfaces of the internal electrodes and the melted solder powder are joined together and internal electrodes opposed to each other are electrically connected. Meanwhile, the gap between the semiconductor chips is filled with the resin component of the thermosetting adhesive film to form an insulating area 101, by which internal electrodes adjacent to each other are electrically insulated.

Heating temperature is suitably selected depending on the compositions of the solder powder and the thermosetting adhesive film. However, in this embodiment, a curing temperature $T_1$ of thermosetting adhesive film 108 and a melting point $T_2$ of the solder powder 108a preferably satisfy the following formula (II):

$$T_1 \geq T_2 + 20° C. \quad (II)$$

When the curing temperature $T_1$ of the thermosetting adhesive film 108 and the melting point $T_2$ of the solder powder 108a satisfy the relationship, curing of the thermosetting adhesive film can be controlled, and at the same time, the melted solder component between the internal electrodes opposed to each other can aggregate in a self-aligning manner. The curing temperature $T_1$ is more preferably the melting point $T_2+30°$ C. or higher, and even more preferably the melting point $T_2+50°$ C. or higher. An endothermic peak temperature, which is obtained when measuring the adhesive film with the rate of temperature increase of 10° C./min using DSC or the like, is regarded as the curing temperature $T_1$ of the thermosetting adhesive film. An endothermic peak temperature, which is obtained when measuring the solder powder alone with the rate of temperature increase of 10° C./min using DSC or the like, is regarded as the melting point $T_2$ of the solder powder.

As the solder component constituting the solder powder, the same solder component as that constituting the solder bump can be used. The solder component may be suitably selected so that the solder powder has a desired melting point.

Further, the melt viscosity of the thermosetting adhesive film at the melting point $T_2$ of the solder powder is preferably 50 to 5000 Pa·s, and more preferably 100 to 4000 Pa·s. Within this range, the diffusion of the solder component between the internal electrodes can be suppressed, and bleeding of the resin component can be suppressed. The melt viscosity of the thermosetting adhesive film can be measured using a sample in which the thickness of the adhesive film is 100 µm and a dynamic viscoelasticity measurement apparatus with the frequency of 0.1 Hz and the rate of temperature increase of 10° C./min.

At the time point when the heating temperature reaches the melting point of the solder powder, the distance between the internal electrodes opposed to each other may be decreased by applying pressure on the semiconductor chips 10 and 20.

Next, the resin component of the thermosetting adhesive film 108 is completely cured to ensure electrical connection strength and mechanical adhesive strength. The internal electrodes 11 and 21 which are opposed to each other are electrically connected in this way, and the gap between the semiconductor chip 10 and the semiconductor chip 20 can be sealed with the insulating resin.

In this regard, the average particle diameter of the solder powder is suitably selected depending on the surface area of the semiconductor chip and the desired distance between the semiconductor chips, but is preferably about 1 to 100 µm, more preferably 5 to 100 µm, and even more preferably 10 to 50 µm. Within this range, the solder component can be surely aggregated on the surfaces of the internal electrodes. Moreover, bridging between adjacent internal electrodes can be suppressed, and shorting out between adjacent internal electrodes can be prevented. The average particle diameter of the solder powder can be measured, for example, using the laser diffraction and scattering method.

From the viewpoint of ensuring sufficient flowability of resin at the time of adhesion of the thermosetting adhesive film 108, the melting point of the solder powder is generally 100° C. or higher, and more preferably 130° C. or higher. In order to prevent heat deterioration of an element provided on a circuit board or a semiconductor chip at the time of adhesion, the melting point of the solder powder is generally 250° C. or lower, and preferably 230° C. or lower. The blending amount of the solder powder is preferably 20 to 150 parts by weight, and more preferably 40 to 100 parts by weight per 100 parts by weight (total amount) of the constituents of the thermosetting adhesive film other than the solder powder.

As the flux compound contained in the thermosetting adhesive film 108, the same flux compound as that exemplified for the aforementioned embodiment can be used. Further, as the constituents of the thermosetting adhesive film 108 other than the solder powder and the blending amounts thereof, the same constituents and blending amounts as those exemplified in the explanation about the thermosetting adhesive film 106 can be used. The blending ratio of each of the components is defined by an amount with respect to the total amount of the components excluding the solder powder. These components and the solder powder are mixed in a solvent, the obtained varnish is applied on a polyester sheet, and it is dried to obtain the thermosetting adhesive film 108.

The thickness of the thermosetting adhesive film 108 is not particularly limited, but is preferably 1 to 50 µm, and more preferably 3 to 30 µm. Within this range, the gap between the semiconductor chips can be sufficiently filled with the resin component, and mechanical adhesive strength after curing of the resin component can be ensured.

In this embodiment, when the thickness is 100 µm, the melt viscosity of the thermosetting adhesive film 108 at 138° C. is preferably 1 to 10000 Pa·s. Within this range, diffusion of the solder component from the internal electrodes can be suppressed, and at the same time, bleeding of the resin component can be suppressed. Regarding the melt viscosity of the thermosetting adhesive film, the thermosetting adhesive film having the thickness of 100 µm is subjected to measurement using a viscoelasticity measuring apparatus (JASCO International Co., Ltd.) (rate of temperature increase: 10° C./min, frequency: 0.1 Hz, measuring stress by constant distortion), and the viscosity at the atmospheric temperature of 138° C., which is the melting point of Sn/Bi (=42/58), is regarded as a measurement value.

When the melt viscosity is 1 Pa·s or more, the solder powder does not stick out from the semiconductor chip (adherend), and insulation failure can be suppressed. Moreover, reduction in connection reliability and contamination of surrounding members caused by bleeding of the thermosetting adhesive film 108 from the semiconductor chip (adherend) when heating can be suppressed. In addition, defects such as generation of air bubbles and insufficient filling of the resin component in the gap between the semiconductor chips can be prevented. When the melt viscosity is 10000 Pa·s or less, the probability of contact between the solder powder and the curing agent having flux activity is increased, and reduction of the oxidized film is efficiently performed. Moreover, since the solder powder easily moves, the probability that the solder powder remains in the space between the electrodes of the semiconductor chips (adherend) is decreased, and generation of insulation failure can be suppressed. Furthermore, at the time of metal joining of the solder bump and the internal electrode provided on the semiconductor chip, resin between the solder bump and the internal electrode is removed, and therefore generation of defective joint can be suppressed. The melt viscosity is more preferably 10 to 10000 Pa·s, even more preferably 50 to 5000 Pa·s, particularly preferably 100 to 4000 Pa·s, and most preferably 100 to 2000 Pa·s.

The size of the thermosetting adhesive film 108 is suitably adjusted at the time of use to a size sufficient to coat the bonding surface between the semiconductor chip 10 and the semiconductor chip 20. In consideration of adhesiveness, etc., it is desired that the size of the film 108 is larger than at least half the size of the semiconductor chip.

The multiple-layer stack type semiconductor electronic component according to one embodiment of the present invention can be produced in a manner similar to that described above by stacking a semiconductor chip on another semiconductor chip in which through-holes are formed and providing electrical connection to them. Note that semiconductor electronic components produced using these production methods are also included in the scope of the present invention.

3. Semiconductor Device

Figure 5:
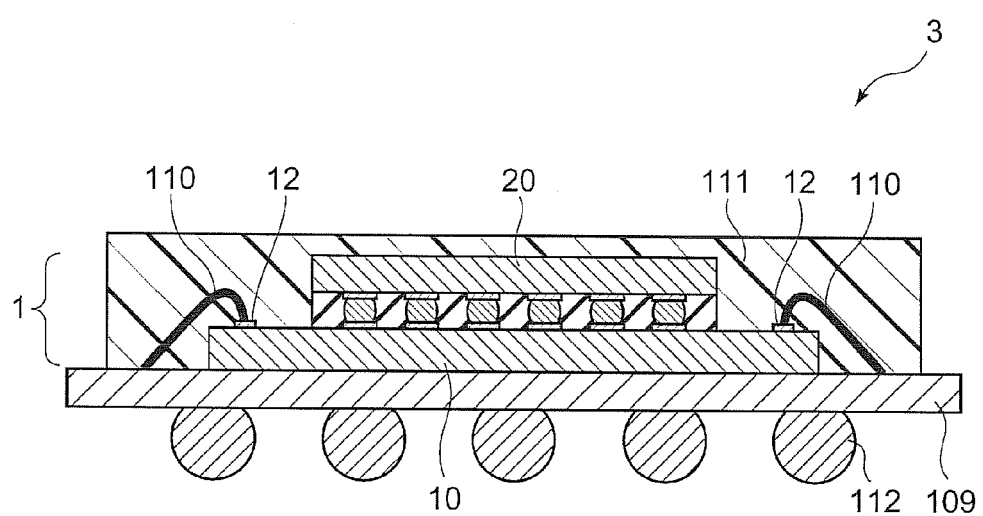
FIG. 5 shows a schematic cross sectional view of a semiconductor device according to one embodiment of the present invention.
Figure 6:
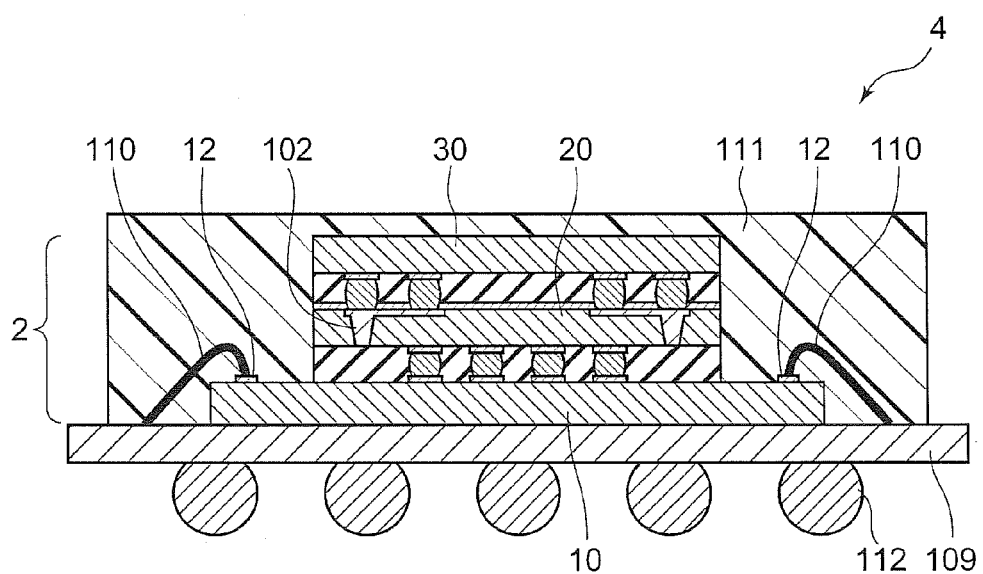
FIG. 6 shows a schematic cross sectional view of a multiple-layer stack type semiconductor device according to one embodiment of the present invention.

Next, as one embodiment of the present invention, a semiconductor device in which a semiconductor electronic component is mounted on a substrate will be described with reference to FIGS. 5 and 6. FIG. 5 shows a schematic cross sectional view of a semiconductor device according to one embodiment of the present invention in which a semiconductor electronic component 1 is mounted. FIG. 6 shows a schematic cross sectional view of a semiconductor device according to another embodiment of the present invention in which a multiple-layer stack type semiconductor electronic component 2 is mounted. Letters or numerals in the drawings correspond to those in the explanation about the semiconductor electronic component 1 and the semiconductor electronic component 2.

As shown in FIG. 5, an external electrode 12 provided on a semiconductor chip 10 and an electrode (not shown) provided on a mount circuit board 109 are electrically connected via a wire 110, and the semiconductor electronic component 1 is mounted on the circuit board 109. The semiconductor electronic component 1, circuit board 109 and wire 110 are sealed with an encapsulating resin 111. Further, a plurality of bump electrodes 112 are provided on the rear surface of the circuit board 109.

In FIG. 6, similarly, an external electrode 12 provided on a semiconductor chip 10 and an electrode (not shown) provided on a circuit board 109 are electrically connected via a wire 110, and a semiconductor electronic component 2 is mounted on the circuit board 109. The semiconductor electronic component 2, circuit board 109 and wire 110 are sealed with an encapsulating resin 111. Further, a plurality of bump electrodes 112 are provided on the rear surface of the circuit board 109.

By using the semiconductor electronic component of the present invention as a semiconductor electronic component to be mounted on a circuit board, a semiconductor device according to this embodiment realizes thickness and size reduction in a whole package. Moreover, by decreasing the distance between internal electrodes of the semiconductor electronic component, the semiconductor device according to this embodiment realizes sophistication.

Sophistication and size reduction in electronic devices are realized by the semiconductor device of this embodiment. The semiconductor device of this embodiment can be applied to a wide range of devices such as cellular phones, digital cameras, video cameras, car navigation devices, personal computers, game machines, liquid crystal televisions, liquid crystal displays, EL displays and printers.

EXAMPLES

Hereinafter, the present invention will be specifically described by way of illustrative examples. However, the present invention is not limited thereto.
<Preparation of Thermosetting Adhesive Film>
Thermosetting adhesive films A to Y were prepared as described below.
(1) Preparation of Thermosetting Adhesive Film A
Components described in Table 1 were mixed with acetone employing the formulation A in Table 1 in a manner in which the solid content was 40 wt %. Varnish thus obtained was applied on a polyester sheet subjected to antistatic treatment using a comma knife-type coater. It was dried for 3 minutes at 70° C., which is the temperature at which the above-described acetone volatilizes, and thereby a thermosetting adhesive film A having the thickness of 25 μm was prepared.
(2) Preparation of Thermosetting Adhesive Film B
Components described in Table 1 were mixed with NMP (N-methyl-2-pyrrolidone) employing the formulation B in Table 1 in a manner in which the solid content was 40 wt %. Varnish thus obtained was applied on a polyester sheet subjected to antistatic treatment using a comma knife-type coater. It was dried for 3 minutes at 150° C., which is the temperature at which the above-described NMP volatilizes, and thereby a thermosetting adhesive film B having the thickness of 15 μm was prepared.
(3) Preparation of Thermosetting Adhesive Films C to F
Components described in Table 1 were mixed with acetone employing the formulations C to F in Table 1 in a manner in which the solid content was 40 wt %. Each varnish thus obtained was applied on a polyester sheet subjected to antistatic treatment using a comma knife-type coater. They were dried for 3 minutes at 70° C., which is the temperature at which the above-described acetone volatilizes, and thereby thermosetting adhesive films C to F, each of which had the thickness of 15 μm, were prepared. Silicon-modified polyimide included in the formulations C and D was synthesized as described below.
(Synthesis of Silicon-Modified Polyimide)
200 g of dehydrated and purified N-methyl-2-pyrrolidone (NMP) was put into a four-neck flask equipped with a dry nitrogen gas introduction tube, a cooler, a thermometer and a stirring machine, and it was vigorously stirred for 10 minutes in nitrogen gas stream.

Next, 29 g of 1,3-bis-(3-aminophenoxy)benzene, 10 g of 3,3-(1,1,3,3,5,5,7,7,9,9,11,11,13,13,15,15,17,17,19,19-eicosamethyl-1,19-decasiloxanediyl)bis-1-propaneamine, and 4 g of 1,3-bis(3-aminopropyl)-1,1,3,3-tetramethyldisiloxane) were added thereto, and the mixture was stirred to obtain a homogeneous state. After it was homogeneously dissolved, a system was cooled to 5° C. with an ice water bath. 40 g of 4,4'-oxydiphthalic dianhydride (powdered state) was added to the mixture over 15 minutes, and after that, stirring was continued for 2 hours. During this period, the flask was maintained at 5° C.

After that, the nitrogen gas introduction tube and the cooler were removed therefrom, and a Dean-Stark tube filled with xylene was attached to the flask. 50 g of toluene was added to the system. After the replacement of the ice water bath with an oil bath, the system was heated to 170° C., and water generated was removed from the system. After heating for 4 hours, generation of water from the system was not observed.

After cooled, the reaction solution was put into a large amount of methanol to separate out polyimide siloxane. After the solid content was filtered, drying under reduced pressure was performed at 80° C. for 12 hours to remove a solvent, and thereby a solid resin was obtained. When measuring infrared absorption spectrum according to the KBr tablet method, absorption at 5.6 μm derived from cyclic imide bond was confirmed, but absorption at 6.06 μm derived from amide bond was not confirmed. Therefore, almost 100% imidization of the resin was confirmed.
(4) Preparation of Thermosetting Adhesive Films G to Q
Components described in Table 2 were mixed with acetone employing the formulations G to Q in Table 2 in a manner in which the solid content was 40 wt %. Each varnish thus obtained was applied on a polyester sheet subjected to antistatic treatment using a comma knife-type coater. They were dried for 3 minutes at 70° C., which is the temperature at which the above-described acetone volatilizes, and thereby thermosetting adhesive films having the thickness of 25 μm were prepared.
(5) Preparation of Thermosetting Adhesive Films R to Y
Components described in Table 3 were mixed with NMP (N-methyl-2-pyrrolidone) employing the formulations R to Y in Table 3 in a manner in which the solid content was 40 wt %. Each varnish thus obtained was applied on a polyester sheet subjected to antistatic treatment using a comma knife-type coater. They were dried for 3 minutes at 150° C., which is the temperature at which the above-described NMP volatilizes, and thereby thermosetting adhesive films having the thickness of 50 μm were prepared.

TABLE 1

| Component | Structure, etc. | Formulation A | Formulation B | Formulation C | Formulation D | Formulation E | Formulation F |
|---|---|---|---|---|---|---|---|
| | | | | | | | Unit (wt %) |
| Acrylic resin | (Butyl acrylate)-(ethyl acrylate)-(acrylonitrile) = 30 mol %/30 mol %/40 mol %, Molecular weight: 850000 | 25.9 | | | | 31.7 | 32.7 |
| High heat-resistance phenoxy resin | YL-6954, manufactured by Japan Epoxy Resins Co., Ltd. | | 25.1 | | | | |
| Silicon-modified polyimide | | | | 44.7 | 33.3 | | |
| Epoxy resin | NC6000, manufactured by Nippon Kayaku Co., Ltd., solid trifunctional epoxy resin, softening point = 60° C. | 24.5 | | | | 47.5 | 32.7 |
| Epoxy resin | EOCN-1020-80, manufactured by Nippon Kayaku Co., Ltd., cresol novolac type epoxy resin, softening point = 80° C. | 16.3 | | | | | |
| Epoxy resin | RE-304S, manufactured by Nippon Kayaku Co., Ltd., liquid bis-F type epoxy resin, epoxy equivalent = 170 | 7.5 | | | | | |
| Epoxy resin | Epiclon 840S, Dainippon Ink and Chemicals, Inc., liquid bis-A type epoxy resin, epoxy equivalent = 180 | | 41.2 | 41.2 | 5.1 | | |
| Sebacic acid | Tokyo Chemical Industry Co., Ltd. | 5.0 | | | | 7.9 | 8.2 |
| Phenolphthalin | Tokyo Chemical Industry Co., Ltd. | | 13.4 | | | | |
| Gentisic acid | Midori Kagaku Co., Ltd. | | | 8.2 | 16.2 | | |
| Phenol novolac | PR-51470, manufactured by Sumitomo Bakelite Co., Ltd., softening point = 110° C., OH equivalent = 104 | 20.2 | | | | | |
| Phenol novolac | PR-53647, manufactured by Sumitomo Bakelite Co., Ltd., softening point = 95° C., OH equivalent = 104 | | 20.3 | 5.9 | 45.4 | | |
| Phenol novolac | PR-HF-3, manufactured by Sumitomo Bakelite Co., Ltd., softening point = 80° C., OH equivalent = 105 | | | | | 12.7 | 26.2 |
| Silane coupling agent | KBM-403E, manufactured by Shin-Etsu Chemical Co., Ltd., epoxysilane | 0.1 | | | | | |
| Silane coupling agent | KBM-573, manufactured by Shin-Etsu Chemical Co., Ltd., aromatic secondary aminosilane | 0.35 | | | | | |
| Imidazole | 2PHZ-PW, manufactured by Shikoku Chemicals Corporation, 2-phenyl-4,5-dihydroxymethyl imidazole | 0.15 | 0.008 | | | 0.16 | 0.16 |
| Solder powder | Sn/Bi = 42/58, melting point = 138° C., average particle diameter; 12 μm | 60 *1 | — | — | — | — | — |
| Film forming resin (A) | | 25.9 | 25.1 | 44.7 | 33.3 | 31.7 | 32.7 |
| Curable resin (B) | | 68.7 | 61.5 | 47.1 | 45.4 | 12.7 | 26.2 |
| Curing agent (C) having flux activity | | 5.0 | 13.4 | 8.2 | 16.2 | 7.9 | 8.2 |
| Melt viscosity (Pa · s) at solder melting point (Sn/Bi = 42/58, 138° C.) | | 340 | — | — | — | — | — |
| Melt viscosity (Pa · s) at solder melting point (Sn/Ag 96.5/3.5, 223° C.) | | — | 70 | 1180 | 760 | — | — |
| Solder wet-spreading ratio (%) | Sn/Ag/Cu = 96.5/3.0/0.5 | — | 53 | 47 | 54 | — | — |
| | Sn/Ag = 96.5/3.5 | — | 56 | 50 | 55 | — | — |

*1 Blend weight ratio when the weight of components other than solder powder is regarded as 100

TABLE 2

| Component | Structure, etc | Formulation G | Formulation H | Formulation I | Formulation J | Formulation K | Formulation L |
|---|---|---|---|---|---|---|---|
| | | | | | | | Unit (wt %) |
| Acrylic resin | (Butyl acrylate)-(ethyl acrylate)-(acrylonitrile) = 30 mol %/30 mol %/40 mol %, Molecular weight: 850000 | 20.3 | | 25.9 | 25.8 | | |
| High heat-resistance phenoxy resin | YL-6954, manufactured by Japan Epoxy Resins Co., Ltd. | | | | | 10.0 | 25.1 |
| Phenoxy resin | FX-280S, manufactured by Tohto Kasei Co., Ltd. | | 10.15 | | | | |
| Phenoxy resin | FX-316, manufactured by Tohto Kasei Co.. Ltd. | | 10.15 | | | | |
| Silicon-modified polyimide | | | | | | | |
| Epoxy resin | NC6000, manufactured by Nippon Kayaku Co., Ltd., solid trifunctional epoxy resin, softening point = 60° C. | 30.0 | 30.0 | 24.5 | 24.5 | | |
| Epoxy resin | EOCN-1020-80, manufactured by Nippon Kayaku Co., Ltd., cresol novolac type epoxy resin, softening point = 80° C. | 20.1 | 20.1 | 13.8 | 11.3 | | |

TABLE 2-continued

Unit (wt %)

| Component | Structure, etc | | | | | | |
|---|---|---|---|---|---|---|---|
| Epoxy resin | RE-304S, manufactured by Nippon Kayaku Co., Ltd., liquid bis-F type epoxy resin, epoxy equivalent = 170 | | | 7.5 | 7.5 | | |
| Epoxy resin | Epiclon 840S, Dainippon Ink and Chemicals, Inc., liquid bis-A type epoxy resin, epoxy equivalent = 180 | | | | | 51.2 | 48.2 |
| Sebacic acid | Tokyo Chemical Industry Co., Ltd. | 5.0 | 5.0 | 10.0 | 15.0 | 13.4 | 3.0 |
| Phenolphthalin | Tokyo Chemical Industry Co., Ltd. | | | | | | |
| Gentisic acid | Midori Kagaku Co., Ltd. | | | | | | |
| Phenol novolac | PR-51470, manufactured by Sumitomo Bakelite Co., Ltd., softening point = 110° C., OH equivalent = 104 | | | 17.7 | 15.2 | | |
| Phenol novolac | PR-53647, manufactured by Sumitomo Bakelite Co., Ltd., softening point = 95° C., OH equivalent = 104 | | | | | 25.4 | 23.7 |
| Phenol novolac | PR-HF-3, manufactured by Sumitomo Bakelite Co., Ltd., softening point = 80° C., OH equivalent = 105 | 8.1 | 8.1 | | | | |
| Allylphenol formaldehyde resin | MEH-8000H, Meiwa Plastic Industries, Ltd. | 16.1 | 16.1 | | | | |
| Silane coupling agent | KBM-403E, Shin-Etsu Chemical Co., Ltd., epoxysilane | 0.35 | 0.35 | 0.1 | 0.1 | | |
| Silane coupling agent | KBM-573, Shin-Etsu Chemical Co., Ltd., aromatic secondary aminosilane | | | 0.35 | 0.35 | | |
| Imidazole | 2PHZ-PW, manufactured by Shikoku Chemicals Corporation, 2-phenyl-4,5-dihydroxymethyl | 0.14 | 0.14 | 0.15 | 0.15 | 0.008 | 0.008 |
| Solder powder | Sn/Bi = 42/58, melting point = 138° C., average particle diameter; 12 μm | 60 *1 | 60 *1 | 60 *1 | 60 *1 | 60 *1 | 60 *1 |
| Film forming resin (A) | | 20.3 | 20.3 | 25.9 | 25.8 | 10.0 | 25.1 |
| Curable resin (B) | | 74.4 | 74.4 | 63.7 | 58.7 | 76.6 | 71.9 |
| Curing agent (C) having flux activity | | 5.0 | 5.0 | 10.0 | 15.0 | 13.4 | 3.0 |
| Melt viscosity (Pa · s) at solder melting point (Sn/Bi = 42/58, 138 C.) | | 55 | 7 | 460 | 630 | 530 | 890 |
| Melt viscosity (Pa · s) at solder melting point (Sn/Ag = 96.5/3.5, 223 C.) | | — | — | — | — | — | — |
| Solder wet-spreading ratio (%) | Sn/Ag/Cu = 96.5/3.0/0.5 | — | — | — | — | — | — |
| | Sn/Ag = 96.5/3.5 | — | — | — | — | — | — |

| Component | Structure, etc | Formulation M | Formulation N | Formulation O | Formulation P | Formulation Q |
|---|---|---|---|---|---|---|
| Acrylic resin | (Butyl acrylate)-(ethyl acrylate)-(acrylonitrile) = 30 mol %/30 mol %/40 mol %, Molecular weight: 850000 | | | | | |
| High heat-resistance phenoxy resin | YL-6954, manufactured by Japan Epoxy Resins Co., Ltd. | 25.1 | 25.1 | 25.1 | 25.1 | 45.0 |
| Phenoxy resin | FX-280S, manufactured by Tohto Kasei Co., Ltd. | | | | | |
| Phenoxy resin | FX-316, manufactured by Tohto Kasei Co.. Ltd. | | | | | |
| Silicon-modified polyimide | | | | | | |
| Epoxy resin | NC6000, manufactured by Nippon Kayaku Co., Ltd., solid trifunctional epoxy resin, softening point = 60° C. | | | | | |
| Epoxy resin | EOCN-1020-80, manufactured by Nippon Kayaku Co., Ltd., cresol novolac type epoxy resin, softening point = 80° C. | | | | | |
| Epoxy resin | RE-304S, manufactured by Nippon Kayaku Co., Ltd., liquid bis-F type epoxy resin, epoxy equivalent = 170 | | | | | |
| Epoxy resin | Epiclon 840S, Dainippon Ink and Chemicals, Inc., liquid bis-A type epoxy resin, epoxy equivalent = 180 | 41.2 | 41.2 | 41.2 | 38.0 | 27.9 |
| Sebacic acid | Tokyo Chemical Industry Co., Ltd. | 13.4 | | | 18.0 | 13.4 |
| Phenolphthalin | Tokyo Chemical Industry Co., Ltd. | | 13.4 | | | |
| Gentisic acid | Midori Kagaku Co., Ltd. | | | 13.4 | | |
| Phenol novolac | PR-51470, manufactured by Sumitomo Bakelite Co., Ltd., softening point = 110° C., OH equivalent = 104 | | | | | |
| Phenol novolac | PR-53647, manufactured by Sumitomo Bakelite Co., Ltd., softening point = 95° C., OH equivalent = 104 | 20.3 | 20.3 | 20.3 | 18.7 | 13.7 |
| Phenol novolac | PR-HF-3, manufactured by Sumitomo Bakelite Co., Ltd., softening point = 80° C., OH equivalent = 105 | | | | | |
| Allylphenol formaldehyde resin | MEH-8000H, Meiwa Plastic Industries, Ltd. | | | | | |
| Silane coupling agent | KBM-403E, Shin-Etsu Chemical Co., Ltd., epoxysilane | | | | | |
| Silane coupling agent | KBM-573, Shin-Etsu Chemical Co., Ltd., aromatic secondary aminosilane | | | | | |
| Imidazole | 2PHZ-PW, manufactured by Shikoku Chemicals Corporation, 2-phenyl-4,5-dihydroxymethyl | 0.008 | 0.008 | 0.008 | 0.008 | 0.008 |
| Solder powder | Sn/Bi = 42/58, melting point = 138° C., average particle diameter; 12 μm | 60 *1 | 60 *1 | 60 *1 | 60 *1 | 60 *1 |

TABLE 2-continued

|  | Unit (wt %) | | | | |
|---|---|---|---|---|---|
| Film forming resin (A) | 25.1 | 25.1 | 25.1 | 25.1 | 45.0 |
| Curable resin (B) | 61.5 | 61.5 | 61.5 | 56.7 | 41.6 |
| Curing agent (C) having flux activity | 13.4 | 13.4 | 13.4 | 18.0 | 13.4 |
| Melt viscosity (Pa · s) at solder melting point (Sn/Bi = 42/58, 138 C.) | 970 | 1260 | 1040 | 1010 | 1420 |
| Melt viscosity (Pa · s) at solder melting point (Sn/Ag = 96.5/3.5, 223 C.) | — | — | — | — | — |
| Solder wet-spreading ratio (%) Sn/Ag/Cu = 96.5/3.0/0.5 | — | — | — | — | — |
| Sn/Ag = 96.5/3.5 | — | — | — | — | — |

*1 Blend weight ratio when the weight of components other than solder powder is regarded as 100

TABLE 3

| Component | Structure, etc. | Formulation R | Formulation S | Formulation T | Formulation U | Formulation V | Formulation W | Formulation X | Unit (wt %) Formulation Y |
|---|---|---|---|---|---|---|---|---|---|
| Acrylic resin | (Butyl acrylate)-(ethyl acrylate)-(acrylonitrile) = 30 mol %/30 mol %/40 mol %, Molecular weight: 850000 | | | | | | | 34.5 | 17.25 |
| High heat-resistance phenoxy resin | YL-6954, manufactured by Japan Epoxy Resins Co., Ltd. | 10.0 | 25.1 | 25.1 | 25.1 | 25.1 | 45.0 | | 17.25 |
| Phenoxy resin | FX-280S, manufactured by Tohto Kasei Co., Ltd. | | | | | | | | |
| Phenoxy resin | FX-316, manufactured by Tohto Kasei Co., Ltd. | | | | | | | | |
| Silicon-modified polyimide | | | | | | | | | |
| Epoxy resin | NC6000, manufactured by Nippon Kayaku Co., Ltd., solid trifunctional epoxy resin, softening point = 60° C. | | | | | | | 55.45 | 55.45 |
| Epoxy resin | EOCN-1020-80, manufactured by Nippon Kayaku Co., Ltd., cresol novolac type epoxy resin, softening point = 80° C. | | | | | | | | |
| Epoxy resin | RE-304S, manufactured by Nippon Kayaku Co., Ltd., liquid bis-F type epoxy resin, epoxy equivalent = 170 | | | | | | | | |
| Epoxy resin | Epiclon 840S, Dainippon Ink and Chemicals, Inc., liquid bis-A type epoxy resin, epoxy equivalent = 180 | 51.2 | 48.2 | 41.2 | 41.2 | 38.2 | 27.9 | | |
| Sebacic acid | Tokyo Chemical Industry Co., Ltd. | | | 13.4 | | | | | |
| Phenolphthalin | Tokyo Chemical Industry Co., Ltd. | 13.4 | 3.0 | | | 18.0 | 13.4 | 15.2 | 15.2 |
| Gentisic acid | Midori Kagaku Co., Ltd. | | | | 13.4 | | | | |
| Phenol novolac | PR-51470, manufactured by Sumitomo Bakelite Co., Ltd., softening point = 110° C. OH equivalent = 104 | | | | | | | | |
| Phenol novolac | PR-53647, manufactured by Sumitomo Bakelite Co., Ltd., softening point = 95° C. OH equivalent = 104 | 25.4 | 23.7 | 20.3 | 20.3 | 18.7 | 13.7 | 12.1 | 12.1 |
| Phenol novolac | PR-HF-3, manufactured by Sumitomo Bakelite Co., Ltd., softening point = 80° C., OH equivalent = 105 | | | | | | | | |
| Allylphenol formaldehyde resin | MEH-8000H, Meiwa Plastic Industries, Ltd. | | | | | | | | |
| Silane coupling agent | KBM-403E, Shin-Etsu Chemical Co., Ltd., epoxysilane | | | | | | | 0.5 | 0.5 |
| Silane coupling agent | KBM-573, Shin-Etsu Chemical Co., Ltd., aromatic secondary aminosilane | | | | | | | | |
| Imidazole | 2PHZ-PW, manufactured by Shikoku Chemicals Corporation, 2-phenyl-4,5-dihydroxymethyl imidazole | 0.008 | 0.008 | 0.008 | 0.008 | 0.008 | | 0.1 | 0.1 |
| Solder powder | Sn/Bi = 42/58, melting point = 138° C., average particle diameter; 12 μm | — | — | — | — | — | — | — | — |
| Film forming resin (A) | | 10.0 | 25.1 | 25.1 | 25.1 | 25.1 | 45.0 | 34.5 | 34.5 |
| Curable resin (B) | | 76.6 | 71.9 | 61.5 | 61.5 | 56.9 | 41.6 | 67.7 | 67.7 |
| Curing agent (C) having flux activity | | 13.4 | 3.0 | 13.4 | 13.4 | 18.0 | 13.4 | 15.2 | 15.2 |
| Melt viscosity (Pa · s) at solder melting point (Sn/Bi = 42/58, 138° C.) | | — | — | — | — | — | — | — | — |
| Melt viscosity (Pa · s) at solder melting point | | 10 | 40 | 50 | 110 | 90 | 310 | 180000 | 150000 |
| Solder wet-spreading ratio (%) | Sn/Ag/Cu = 96.5/3.0/0.5 | 57 | 43 | 66 | 55 | 59 | 49 | 54 | 56 |
| | Sn/Ag = 96.5/3.5 | 59 | 45 | 68 | 58 | 62 | 51 | 55 | 58 |

[1] Measurement of Melt Viscosity at Solder Melting Point

The melt viscosity of each of the thermosetting adhesive films A to Y at the solder melting point was measured as described below. Regarding the thermosetting adhesive films A and G to Q, the melt viscosity of each of the films was measured under the measurement conditions 1 described below. Regarding the thermosetting adhesive films B to D and R to Y, the melt viscosity of each of the films was measured under the measurement conditions 2 described below.

(Measurement Conditions 1)

The thermosetting adhesive film having the thickness of 100 μm was subjected to measurement using a viscoelasticity measuring apparatus (JASCO International Co., Ltd.) (rate of temperature increase: 10° C./min, frequency: 0.1 Hz, measuring stress by constant distortion), and the viscosity at the atmospheric temperature of 138° C., which is the melting point of Sn/Bi (=42/58), was regarded as a measurement value.

(Measurement Conditions 2)

The thermosetting adhesive film having the thickness of 100 μm was subjected to measurement using a viscoelasticity measuring apparatus (JASCO International Co., Ltd.) (rate of temperature increase: 30° C./min, frequency: 1.0 Hz, measuring stress by constant distortion), and the viscosity at the atmospheric temperature of 223° C., which is the melting point of Sn/Ag (=96.5/3.5), was regarded as a measurement value.

[2] Measurement of Solder Wet-Spreading Ratio

The solder wet-spreading ratio of each of the thermosetting adhesive films B to D and R to Y was measured as described below.

(1) The thermosetting adhesive film having the thickness of 15 μm was attached to a bare Cu plate (manufactured by Hirai Seimitsu Kogyo Co., Ltd.).

(2) On the thermosetting adhesive film, the following solder balls having the diameter of 500 μm are stationarily placed.

(i) "M31" (Sn/Ag/Cu, melting point: 217° C., manufactured by Senju Metal Industry Co., Ltd.)

(ii) "L20" (Sn/Bi, melting point: 138° C., manufactured by Senju Metal Industry Co., Ltd.)

(3) Based on ASTM B 545, a hot plate is heated to a temperature which is 30° C. higher than the melting point of each of the solders, and the above-described sample is heated on the hot plate for 20 seconds.

(4) The height of the solder balls wet-spread on the bare Cu plate is measured.

(5) The solder wet-spreading ratio is calculated using the following formula (I):

Solder wet-spreading ratio(%)=[{(diameter of solder ball)−(thickness of solder after wet spreading)}/(diameter of solder ball)]×100     (I)

The measurement results of the melt viscosity and the solder wet-spreading ratio at the solder melting point are shown in Tables 1 and 3.

<Production of Semiconductor Electronic Components>

Figure 7:
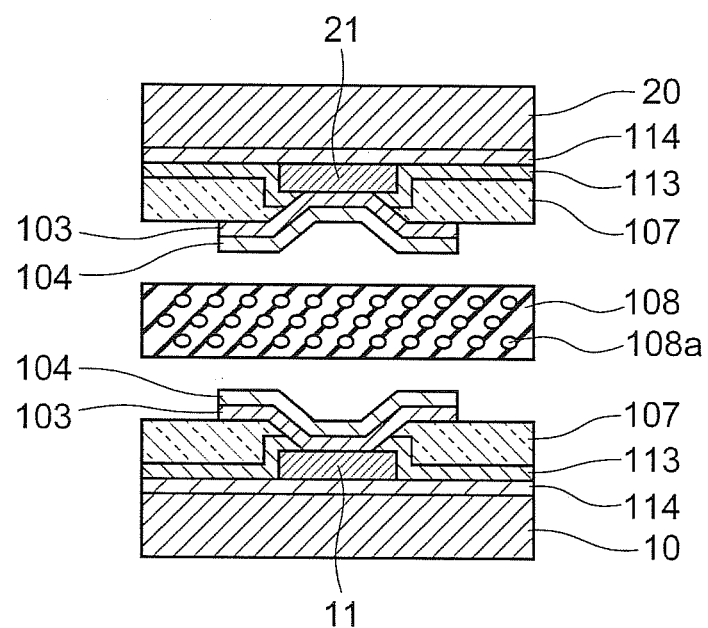
FIG. 7 shows an explanatory drawing for steps in a method for producing the semiconductor electronic component of the Examples of the present invention.
Figure 8:
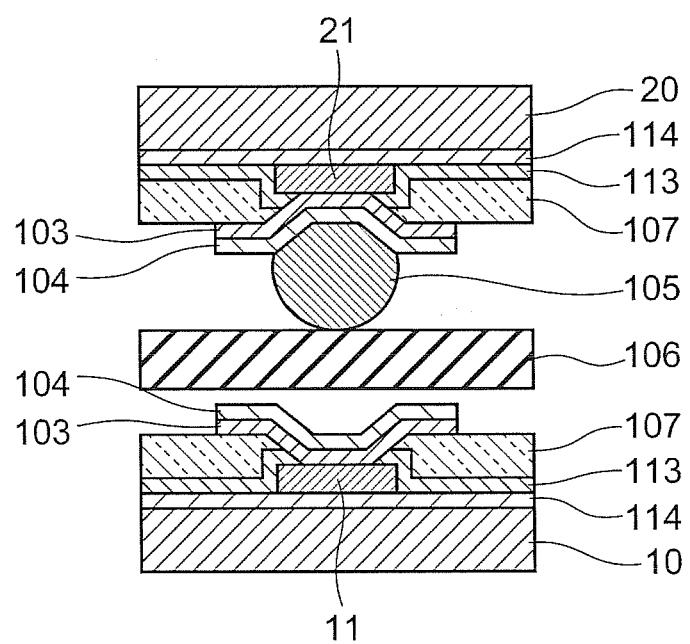
FIG. 8 shows an explanatory drawing for steps in a method for producing the semiconductor electronic component of the Examples of the present invention.

Next, semiconductor electronic components having the structure shown in FIG. 1 were produced using the obtained thermosetting adhesive films A to Y. FIG. 7 shows an explanatory drawing for steps in the production methods in Examples 1, 2 and 13 to 28. FIG. 8 shows an explanatory drawing for steps in the production methods in Examples 3 to 12 and 29 to 40. Hereinafter, Examples 1, 2 and 13 to 28 will be described with reference to FIG. 7, and Examples 3 to 12 and 29 to 40 will be described with reference to FIG. 8.

Examples 1, 2

Firstly, a thermally-oxidized film 114 having the thickness of 0.4 μm was formed on each of the whole circuit surfaces of the semiconductor chips 10 and 20. Next, as a metal layer, aluminum/0.5 Cu was sputtered to have the thickness of 0.4 μm. Utilizing resist, portions other than those required for wiring were dry-etched to form internal electrodes 11 and 21. After removing mask, a SiN film (passivating layer) 113 having the thickness of 0.2 μm was formed on the whole surface using the CVD method. Further, utilizing resist, the metal layer portion (internal electrode surface) was soft-etched. Next, a polyimide layer having the thickness of 3 μm was applied and developed, and thereby the metal layer portion was opened. Further, the polyimide layer was cured to form a stress relaxation layer (protecting layer) 107. Next, Ti having the thickness of 0.05 μm and Cu having the thickness of 1 μm were sputtered in this order to form UBM layers 103 and 104. Thus, on each of the semiconductor chips 10 and 20, a connection pad (pad size: 60μ×60μ, distance between pads: 40 μm, pad pitch: 100 μm) was formed (semiconductor chip 10: 10 mm×10 mm, thickness: 725 μm; semiconductor chip 20: 6 mm×6 mm, thickness: 725 μm). In Example 1, an external electrode was disposed on the semiconductor chip 10 so that the distance Y became 750 μm. In Example 2, an external electrode was disposed so that the distance Y became 250 μm.

Subsequently, thermosetting adhesive film A was cut to a size equal to the connection pad surface of the semiconductor chip 10 (6 mm×6 mm), and attachment thereof was performed on a heat board at 80° C. After that, a polyester sheet (substrate) was peeled off. Next, the connection pad surface of the semiconductor chip 20 and the connection pad surface of the semiconductor chip 10 were arranged to be opposed to each other, and alignment was carried out. In the alignment, a camera attached to a flip chip bonder (manufactured by Shibuya Kogyo Co., Ltd., DB200) recognized alignment marks on the connection pad surfaces of the chips. After that, using this flip chip bonder, thermocompression bonding was carried out under the first heating conditions described in Table 4, and solder connection was performed. Further, an oven was set to meet the second heating conditions described in Table 4, and by predetermined heat history, an adhesive was cured. Thus, semiconductor electronic components having the distances X, Y and Z shown in Table 4 were obtained.

Examples 13-16

Semiconductor electronic components were obtained in a manner similar to that in Examples 1 and 2 except that the thermosetting adhesive film G or H was used instead of the thermosetting adhesive film A. In Examples 13 and 15, an external electrode was disposed on the semiconductor chip 10 so that the distance Y became 750 μm. In Examples 14 and 16, an external electrode was disposed so that the distance Y became 250 μm. Thus, semiconductor electronic components having the distances X, Y and Z shown in Table 4 were obtained.

Examples 17-28

Semiconductor electronic components were obtained in a manner similar to that in Examples 1 and 2 except that the thermosetting adhesive film and heating conditions shown in Table 5 were used. In Examples 17 to 28, an external electrode was disposed on the semiconductor chip 10 so that the distance Y became 250 μm. Thus, semiconductor electronic components having the distances X, Y and Z shown in Table 5 were obtained.

Examples 3-12

Firstly, on each of the circuit surfaces of the semiconductor chips 10 and 20, a connection pad (pad size: 60μ×60μ, distance between pads: 40 μm, pad pitch: 100 μm) was formed in a manner similar to that in Examples 1 and 2. Further, on the connection pad formed on the semiconductor chip 20, utilizing a mask in which the portion of UBM layer 104 was opened, a Sn—Ag solder ball having the diameter of 50 μm was mounted on the UBM 104 on which flux was applied. Next, by means of reflow, the solder ball and the UBM layer 104 were joined together to form a solder bump 105 (see FIG. 8). As the semiconductor chips 10 and 20, the same chips as those in Examples 1 and 2 were used.

Subsequently, each of the thermosetting adhesive films B to F was cut to a size equal to the connection pad surface of the semiconductor chip 10 (6 mm×6 mm), and attachment thereof was performed on a heat board at 80° C. After that, a polyester sheet (substrate) was peeled off. Next, the connection pad surface of the semiconductor chip 20 and the connection pad surface of the semiconductor chip 10 were arranged to be opposed to each other, and alignment was carried out in a manner similar to that in Examples 1 and 2. After that, using the flip chip bonder, thermocompression bonding was carried out under the first heating conditions described in Table 4, and solder connection was performed. Further, the oven was set to meet the second heating conditions described in Table 4, and by predetermined heat history, an adhesive was cured. Thus, semiconductor electronic components having the distances X, Y and Z shown in Table 4 were obtained.

Examples 29-40

Semiconductor electronic components were obtained in a manner similar to that in Examples 3 to 12 except that the thermosetting adhesive film and heating conditions shown in Table 6 were used. In Examples 29 to 40, an external electrode was disposed on the semiconductor chip 10 so that the distance Y became 250 μm. Thus, semiconductor electronic components having the distances X, Y and Z shown in Table 6 were obtained.

Test Examples

Measurement of distances X, Y and Z, conductivity test and evaluation of contamination of external electrodes were carried out as described below.

(1) Measurement of Distances X, Y and Z

The obtained semiconductor electronic component was embedded in thermosetting epoxy resin (Nippon Kayaku Co., Ltd.: RE-403S, Fuji Kasei Kogyo Co., Ltd.: Fujicure 5300), and cross-sectional polishing was carried out. The obtained section was projected using a digital microscope manufactured by Keyence Corporation. Utilizing an image-editing software VHS-500, the distances X, Y and Z were calculated.

(2) Conductivity Test

Using a hand tester, the connection ratio of the semiconductor chip of the obtained semiconductor electronic component was measured after the lamination of the semiconductor chip and 1000 hours after the heat cycle test (a cycle at −65° C. for 1 hour and a cycle at 150° C. for 1 hour were alternately repeated). The connection ratio was calculated using the following formula:

Connection ratio(%)={(Number of conducted pads)/(Number of measured pads)}×100

Evaluation criteria are as follows:
○: connection ratio of 100%
x: connection ratio of less than 100%

(3) Evaluation of Contamination of External Electrodes

The external electrode 12 (wire-bonding pad) on the semiconductor chip 10 of the obtained semiconductor electronic component was observed using a metallographic microscope to confirm whether or not it was contaminated with the thermosetting adhesive film. The evaluation criteria are as follows:

Contamination of external electrode is absent (the thermosetting adhesive film did not reach the external electrode)

Contamination of external electrode is present (the thermosetting adhesive film reached the external electrode)

Results thereof are as shown in Tables 4 to 6.

TABLE 4

|  |  | Ex. 1 | Ex. 2 | Ex. 3 | Ex. 4 | Ex. 5 | Ex. 6 | Ex. 7 | Ex. 8 | Ex. 9 | Ex. 10 |
|---|---|---|---|---|---|---|---|---|---|---|---|
|  |  | Formulation A | | Formulation B | | Formulation C | | Formulation D | | Formulation E | |
| First heating | Temperature | 160° C. | | 260° C. | | 260° C. | | 260° C. | | 260° C. | |
|  | Pressure | 10 kgf | | 5 kgf | | 1 kgf | | 1 kgf | | 1 kgf | |
|  | Time | 12 sec | | 60 sec | | 60 sec | | 60 sec | | 10 sec | |
| Second heating | Temperature | 180° C. | | 180° C. | | 180° C. | | 180° C. | | 180° C. | |
|  | Pressure | 0 kgf | | 0 kgf | | 0 kgf | | 0 kgf | | 0 kgf | |
|  | Time | 60 min | | 60 min | | 60 min | | 60 min | | 60 min | |
| Distance X (μm) |  | 3 | 3 | 41 | 42 | 46 | 47 | 44 | 45 | 42 | 43 |
| Distance Y (μm) |  | 750 | 250 | 750 | 250 | 750 | 250 | 750 | 250 | 750 | 250 |
| Distance Z (μm) |  | 40 | 40 | 40 | 40 | 40 | 40 | 40 | 40 | 40 | 40 |
| Conductivity test | Primary stage | ○ | ○ | ○ | ○ | ○ | ○ | ○ | ○ | ○ | ○ |
|  | 1000 hours after heat cycle test | ○ | ○ | ○ | ○ | ○ | ○ | ○ | ○ | ○ | ○ |
| Contamination of external electrode |  | Absent | Absent | Abaent | Absent | Absent | Absent | Absent | Absent | Absent | Absent |
| Curing temperature of adhesive film (° C.) |  | 195 | | 205 | | 225 | | 220 | | 190 | |
| Melting point of solder bump (solder powder) (° C.) |  | 139 | | 217 | | 217 | | 217 | | 217 | |

|  |  | Ex. 11 | Ex. 12 | Ex. 13 | Ex. 14 | Ex. 15 | Ex. 16 |
|---|---|---|---|---|---|---|---|
|  |  | Formulation F | | Formulation G | | Formulation H | |
| First heating | Temperature | 260° C. | | 160° C. | | 160° C. | |
|  | Pressure | 1 kgf | | 10 kgf | | 10 kgf | |
|  | Time | 10 sec | | 12 sec | | 12 sec | |
| Second heating | Temperature | 180° C. | | 180° C. | | 180° C. | |
|  | Pressure | 0 kgf | | 0 kgf | | 0 kgf | |
|  | Time | 60 min | | 60 min | | 60 min | |

TABLE 4-continued

|  |  |  |  |  |  |  |  |
|---|---|---|---|---|---|---|---|
| Distance X (μm) |  | 44 | 44 | 2.9 | 2.9 | 2.7 | 2.7 |
| Distance Y (μm) |  | 750 | 250 | 750 | 250 | 750 | 250 |
| Distance Z (μm) |  | 40 | 40 | 40 | 40 | 40 | 40 |
| Conductivity test | Primary stage | ○ | ○ | ○ | ○ | ○ | ○ |
|  | 1000 hours after heat cycle test | ○ | ○ | ○ | ○ | ○ | ○ |
| Contamination of external electrode |  | Absent | Absent | Absent | Absent | Absent | Absent |
| Curing temperature of adhesive film (° C.) |  | 185 | | 207 | | 213 | |
| Melting point of solder bump (solder powder) (° C.) |  | 217 | | 139 | | 139 | |

TABLE 5

|  |  | Ex. 17 Form. A | Ex. 18 Form. I | Ex. 19 Form. J | Ex. 20 Form. K | Ex. 21 Form. L | Ex. 22 Form. M | Ex. 23 Form. N | Ex. 24 Form. O | Ex. 25 Form. P | Ex. 26 Form. Q | Ex. 27 Form. G | Ex. 28 Form. H |
|---|---|---|---|---|---|---|---|---|---|---|---|---|---|
| First heating | Temperature | | | | | | 160° C. | | | | | | |
|  | Pressure | | | | | | 10 kgf | | | | | | |
|  | Time | | | | | | 60 sec | | | | | | |
| Second heating | Temperature | | | | | | 180° C. | | | | | | |
|  | Pressure | | | | | | 0 kgf | | | | | | |
|  | Time | | | | | | 60 mi | | | | | | |
| Distance X (μm) | | 0.4 | 0.5 | 0.6 | 0.5 | 0.9 | 1.0 | 1.4 | 1.1 | 1.1 | 1.6 | 0.3 | 0.3 |
| Distance Y (μm) | | 250 | 250 | 250 | 250 | 250 | 250 | 250 | 250 | 250 | 250 | 250 | 250 |
| Distance Z (μm) | | 40 | 40 | 40 | 40 | 40 | 40 | 40 | 40 | 40 | 40 | 40 | 40 |
| Conductivity test | Primary stage | ○ | ○ | ○ | ○ | ○ | ○ | ○ | ○ | ○ | ○ | ○ | ○ |
|  | 1000 hours after heat cycle test | ○ | ○ | ○ | ○ | ○ | ○ | ○ | ○ | ○ | ○ | ○ | ○ |
| Contamination of external electrode | | Absent | Absent | Absent | Absent | Absent | Absent | Absent | Absent | Absent | Absent | Absent | Absent |

TABLE 6

|  |  | Ex. 29 Form. R | Ex. 30 Form. S | Ex. 31 Form. B | Ex. 32 Form. T | Ex. 33 Form. U | Ex. 34 Form. V | Ex. 35 Form. W | Ex. 36 Form. C | Ex. 37 Form. D | Ex. 38 Form. X | Ex. 40 Form. Y |
|---|---|---|---|---|---|---|---|---|---|---|---|---|
| First heating | Temperature | | | | | | 260° C. | | | | | |
|  | Pressure | | | | | | 1 kgf | | | | | |
|  | Time | | | | | | 60 sec | | | | | |
| Second heating | Temperature | | | | | | 180° C. | | | | | |
|  | Pressure | | | | | | 0 kgf | | | | | |
|  | Time | | | | | | 60 min | | | | | |
| Distance X (μm) | | 39 | 42 | 42 | 41 | 44 | 43 | 44 | 47 | 45 | 47 | 45 |
| Distance Y (μm) | | 250 | 250 | 250 | 250 | 250 | 250 | 250 | 250 | 250 | 250 | 250 |
| Distance Z (μm) | | 40 | 40 | 40 | 40 | 40 | 40 | 40 | 40 | 40 | 40 | 40 |
| Conductivity test | Primary stage | ○ | ○ | ○ | ○ | ○ | ○ | ○ | ○ | ○ | ○ | ○ |
|  | 1000 hours after heat cycle test | ○ | ○ | ○ | ○ | ○ | ○ | ○ | ○ | ○ | ○ | ○ |
| Contamination of external electrode | | Absent | Absent | Absent | Absent | Absent | Absent | Absent | Absent | Absent | Absent | Absent |

As shown in Tables 4, 5 and 6, in Examples 1 to 40, there was no contamination of external electrode, and semiconductor electronic components satisfying the desired distances X, Y and Z were successfully obtained. Further, it is understood that the results of conductivity test are favorable and excellent connection reliability was obtained. By mounting the semiconductor electronic component thus obtained on a substrate according to the common method, the semiconductor device of the present invention can be obtained.

Thus, it was shown that a semiconductor electronic component, on which semiconductor chips are mounted with high density, to be applied to a chip-on-chip type system in package can be produced according to the present invention.

INDUSTRIAL APPLICABILITY

According to the present invention, a semiconductor electronic component on which semiconductor integrated circuit is mounted with high density and a semiconductor device can be obtained. By using the semiconductor electronic component and the semiconductor device of the present invention, electronic components which can meet requirements for sophistication and miniaturization can be produced.

The invention claimed is:

1. A chip-on-chip type semiconductor electronic component, which comprises: a first semiconductor chip having a circuit surface on which first internal electrodes and first external electrodes are provided; and a second semiconductor chip having a circuit surface on which second internal electrodes electrically connected to the first internal electrodes are provided, wherein the circuit surface of the first semiconductor chip and the circuit surface of the second semiconductor chip are opposed to each other, and wherein:

the gap between the first semiconductor chip and the second semiconductor chip is filled with an insulating resin;

the distance between the first semiconductor chip and the second semiconductor chip is 50 μm or less; and the shortest distance between the side surface of the second semiconductor chip and the first external electrode is 1 mm or less.

2. The semiconductor electronic component according to claim 1, wherein the shortest distance between the first internal electrodes adjacent to each other is 50 μm or less.

3. The semiconductor electronic component according to claim 1, wherein the second semiconductor chip is provided on an approximate center area of the first semiconductor chip.

4. The semiconductor electronic component according to claim 1, wherein the first external electrodes are provided on the marginal portion of the first semiconductor chip.

5. The semiconductor electronic component according to claim 1, wherein: between the first semiconductor chip and the second semiconductor chip, solder bumps provided on at least either one of the first internal electrodes and the second internal electrodes and a thermosetting adhesive film comprising a flux compound are interposed to be heat-sealed, and thereby the first internal electrodes and the second internal electrodes are electrically connected to each other; and the gap between the first semiconductor chip and the second semiconductor chip is filled with the insulating resin.

6. The semiconductor electronic component according to claim 5, wherein the thermosetting adhesive film comprises 10 to 50 wt % of film forming resin, 30 to 80 wt % of curable resin and 1 to 20 wt % of curing agent configured to act as a flux solder to an extent that the thermosetting adhesive film can be electrically connected with the first internal electrodes and the second internal electrodes.

7. The semiconductor electronic component according to claim 6, wherein the film forming resin is at least one substance selected from the group consisting of (meth)acrylic resin, phenoxy resin and polyimide resin.

8. The semiconductor electronic component according to claim 6, wherein the curable resin is epoxy resin.

9. The semiconductor electronic component according to claim 6, wherein the curing agent is at least one substance selected from the group consisting of aliphatic dicarboxylic acid and compounds having a carboxyl group and a phenolic hydroxyl group.

10. The semiconductor electronic component according to claim 5, wherein, in the case where a tin-containing solder ball having the diameter of 500 μm is provided on the thermosetting adhesive film and heated at a temperature which is 30° C. higher than the melting point of the solder ball for 20 seconds, the solder wet-spreading ratio of the thermosetting adhesive film represented by the following formula (I) is 40% or higher:

Solder wet-spreading ratio(%)=[{(diameter of solder ball)−(thickness of solder after wet spreading)}/(diameter of solder ball)]×100 (I).

11. The semiconductor electronic component according to claim 5, wherein, in the case where the thickness of the thermosetting adhesive film is 100 μm, the melt viscosity thereof at 223° C. is 10 Pa·s to 200000 Pa·s.

12. The semiconductor electronic component according to claim 1, wherein: between the first semiconductor chip and the second semiconductor chip, a thermosetting adhesive film comprising solder powder and a flux compound is interposed to be heat-sealed, and thereby the first internal electrodes and the second internal electrodes are electrically connected to each other; and the gap between the first semiconductor chip and the second semiconductor chip is filled with the insulating resin.

13. The semiconductor electronic component according to claim 12, wherein constituents other than the solder powder in the thermosetting adhesive film comprise 10 to 50 wt % of film forming resin, 30 to 80 wt % of curable resin and 1 to 20 wt % of curing agent configured to act as a flux solder to an extent that the thermosetting adhesive film can be electrically connected with the first internal electrodes and the second internal electrodes.

14. The semiconductor electronic component according to claim 13, wherein the film forming resin is at least one substance selected from the group consisting of (meth)acrylic resin, phenoxy resin and polyimide resin.

15. The semiconductor electronic component according to claim 13, wherein the curable resin is epoxy resin.

16. The semiconductor electronic component according to claim 13, wherein the curing agent is at least one substance selected from the group consisting of aliphatic dicarboxylic acid and compounds having a carboxyl group and a phenolic hydroxyl group.

17. The semiconductor electronic component according to claim 12, wherein the thermosetting adhesive film comprises 30 to 200 parts by weight of solder powder per 100 parts by weight of constituents other than the solder powder.

18. The semiconductor electronic component according to claim 12, wherein a curing temperature $T1$ of the thermosetting adhesive film and a melting point $T2$ of the solder powder satisfy the following formula (II):

$$T1 > T2 + 20° C. \quad (II)$$

and the melt viscosity of the thermosetting adhesive film at the melting point $T2$ of the solder powder is 50 Pa·s to 5000 Pa·s.

19. The semiconductor electronic component according to claim 12, wherein, in the case where the thickness of the thermosetting adhesive film is 100 μm, the melt viscosity thereof at 138° C. is 1 Pa·s to 10000 Pa·s.

20. The semiconductor electronic component according to claim 1, wherein a semiconductor chip is further provided on a surface opposite to the circuit surface of the second semiconductor chip.

21. The semiconductor electronic component according to claim 1, further comprising a third semiconductor chip having a circuit surface on which a third internal electrode is provided, wherein:

the circuit surface of the third semiconductor chip is opposed to the surface opposite to the circuit surface of the second semiconductor chip;

the gap between the second semiconductor chip and the third semiconductor chip is filled with the insulating resin; and the third internal electrode is electrically connected to the second internal electrode via through-holes provided in the thickness direction of the second semiconductor chip.

22. A semiconductor device on which the semiconductor electronic component according to claim 1 is mounted.

23. The semiconductor electronic component according to claim 1, wherein the second semiconductor chip is smaller than the first semiconductor chip.

24. The semiconductor electronic component according to claim 1, wherein the first external electrodes are provided at locations that are not overlapped by the second semiconductor chip.

25. The semiconductor electronic component according to claim 1, wherein the first external electrodes are not covered by the insulating resin provided between the first semiconductor chip and the second semiconductor chip is filled with an insulating resin.

26. The semiconductor electronic component according to claim 1, wherein the shortest distance between the side surface of the second semiconductor chip and the first external electrode is 0.05 mm to 1 mm.

27. A chip-on-chip type semiconductor electronic component, which comprises: a first semiconductor chip having a circuit surface on which first internal electrodes and first external electrodes are provided; and a second semiconductor chip having a circuit surface on which second internal electrodes electrically connected to the first internal electrodes are provided, wherein the circuit surface of the first semiconductor chip and the circuit surface of the second semiconductor chip are opposed to each other, and wherein:

the gap between the first semiconductor chip and the second semiconductor chip is filled with an insulating resin;

the distance between the first semiconductor chip and the second semiconductor chip is 25 μm or less; and the shortest distance between the side surface of the second semiconductor chip and the first external electrode is 1 mm or less.

* * * * *

UNITED STATES PATENT AND TRADEMARK OFFICE
CERTIFICATE OF CORRECTION

PATENT NO.         : 8,629,564 B2
APPLICATION NO.    : 12/447658
DATED              : January 14, 2014
INVENTOR(S)        : Katsurayama et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 650 days.

Signed and Sealed this
Twenty-second Day of September, 2015

Michelle K. Lee
*Director of the United States Patent and Trademark Office*